US006288961B1

(12) United States Patent
Tanaka et al.

(10) Patent No.: US 6,288,961 B1
(45) Date of Patent: *Sep. 11, 2001

(54) SEMICONDUCTOR MEMORY DEVICE FOR READING CHARGES STORED IN CAPACITOR IN MEMORY CELL AND DATA READING METHOD THEREOF

(75) Inventors: Sumio Tanaka, Tokyo; Ryu Ogiwara, Yokohama, both of (JP)

(73) Assignee: Kabushiki Kaisha Toshiba, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/458,094

(22) Filed: Dec. 10, 1999

Related U.S. Application Data

(62) Division of application No. 09/193,131, filed on Nov. 17, 1998.

(30) Foreign Application Priority Data

Nov. 18, 1997 (JP) .................................................. 9-317130

(51) Int. Cl.⁷ .................................................. G11C 7/00
(52) U.S. Cl. .................................................. 365/210
(58) Field of Search .................................. 365/210, 205, 365/207, 208

(56) References Cited

U.S. PATENT DOCUMENTS 4,873,664  10/1989  Eaton, Jr. ............................ 365/145
5,850,366  12/1998  Coleman, Jr. ........................ 365/210

FOREIGN PATENT DOCUMENTS 0 278 167 A   8/1988   (EP) .
0 293 798 A  12/1988   (EP) .
0 917 150 A   5/1999   (EP) .

OTHER PUBLICATIONS

Wayne Kinney, "Signal Magnitudes in High Density Ferroelectric Memories"; Integrated Ferroelectrics, vol. 4, pp. 131–144, 1994.

Joseph T. Evans et al., "An Experimental 512-bit Nonvolatile Memory with Ferroelectric Storage Cell"; IEEE Journal of Solid-State Circuits, vol. 23, No. 5, pp. 1171–1175, 1988.

*Primary Examiner*—Vu A. Le
(74) *Attorney, Agent, or Firm*—Banner & Witcoff, Ltd.

(57) ABSTRACT

A semiconductor memory device reads data corresponding to charges stored in a capacitor in a memory cell and rewrites the data. This semiconductor memory device removes charges stored in the capacitor in the memory cell to a bit line or absorbs charges stored in the bit line into the capacitor in the memory cell, thereby generating a potential difference between the bit line pair. This potential difference is sensed by a sense amplifier and rewritten. Before the sense amplifier is operated, the potential difference is generated between the bit line pair. The parasitic capacitances of the bit line pair during operation of the sense amplifier are substantially equalized, and in this state, the potential difference is sensed.

4 Claims, 14 Drawing Sheets

US 6,288,961 B1

SEMICONDUCTOR MEMORY DEVICE FOR READING CHARGES STORED IN CAPACITOR IN MEMORY CELL AND DATA READING METHOD THEREOF

This application is a divisional of Ser. No. 09/193,131 filed Nov. 17, 1998.

BACKGROUND OF THE INVENTION

The present invention relates to a semiconductor memory device for reading charges stored in a capacitor in a memory cell and a data reading method thereof and, more particularly, to a dynamic random access memory (DRAM) or a ferroelectric memory.

FIG. 1 shows a circuit arrangement of a basic ferroelectric memory as an example of a semiconductor memory device for reading charges stored in a capacitor in a memory cell. This circuit comprises memory cells MC, dummy cells DMC, a sense and rewrite amplifier (sense amplifier) 18, a word line i 19, a word line (i+1) 20, a dummy word line a 21, a dummy word line b 22, a plate line i 23, a plate line (i+1) 24, a dummy plate line a 25, a dummy plate line b 26, a pair of bit lines BL and $\overline{BL}$ as a differential pair, transistors 300 and 301 for selecting a column, a column selection line 302, and a pair of common read data lines DL and $\overline{DL}$. The memory cells MC have ferroelectric capacitors 10 and 11 and selection transistors 14 and 15, respectively. The dummy cells DMC also have ferroelectric capacitors 12 and 13 and selection transistors 16 and 17, respectively.

In the above arrangement, as the direction of the electric field in the ferroelectric memory and the direction of polarization (these two directions match), the direction from the plate line to the bit line is defined as a positive direction. In the ferroelectric memory, the bit lines have a level difference in accordance with direction of polarization of a ferroelectric capacitor storing data. The read operation will be described in detail with reference to the timing chart of FIG. 2. The bit line is precharged to 0 (V) in advance. A word line connected to a cell to be selected is selected, and in this state, a plate line is selected. After the potentials of the pair of bit lines BL and $\overline{BL}$ change, the sense and rewrite amplifier 18 is activated to set one of the bit lines BL and $\overline{BL}$ at high level and the other at low level. In the circuit shown in FIG. 1, when the ith word line 19 is selected, the dummy word line 21 is selected. When the (i+1)th word line 20 is selected, the dummy word line 22 is selected.

Assume that the power supply voltage is 3 (V), and the potentials of the selected plate line and dummy plate line become 3 (V) at maximum. Also, assume that the maximum value of the potentials of the selected word line and dummy word line is boosted to a voltage (e.g., 4.5 (V)) for compensating for a drop in threshold voltage by a cell selection transistor and dummy cell selection transistor such that the high potential of the pair of bit lines BL and $\overline{BL}$ is transmitted to the capacitor.

When polarization in the capacitor in the selected memory cell is directed upward (from the plate line side to the bit line side), polarization inversion does not occur because the direction of polarization matches that of the electric field. In this case, since the amount of charges removed from the cell is small, the level of the bit line is low. To the contrary, when polarization is directed downward (from the bit line side to the plate line side), polarization inversion occurs because polarization and the electric field are directed in opposite directions. In this case, since the amount of charges removed from the cell is large, the level of the bit line is high. Hence, when the areas of the ferroelectric capacitors 12 and 13 in the dummy cells are set to generate the intermediate level between the bit line level when polarization inversion occurs and that when polarization inversion does not take place, the level difference between the bit lines BL and $\overline{BL}$ can be sensed by the sense and rewrite amplifier 18.

The scheme of sensing the bit line level while setting the plate line at high level, as shown in FIG. 2, is called "during plate pulse sensing" for the descriptive convenience. Such a data read operation is disclosed in U.S. Pat. No. 4,873,664. This patent describes that the areas of the ferroelectric capacitors 12 and 13 in the dummy cells are set to be twice those of the ferroelectric capacitors 10 and 11 in the memory cells to generate the intermediate potential. The dummy capacitor in the dummy cell must be biased such that the dummy cell does not operate in the polarization inversion region, i.e., polarization is always directed upward (from the plate line to the bit line).

To clarify the problem of the conventional circuit, the bit line level to be sensed will be described using a graphic solution of the hysteresis characteristics of the ferroelectric capacitor. The positive direction is defined as a direction from the plate line to the bit line. Let $V_f$ be the voltage applied to the ferroelectric capacitor. Referring to FIG. 3, while the potential relationship is changing from (a) to (b), the amount QB of charges in the bit line is kept unchanged because the bit line is not charged/discharged. This situation can be represented as:

$$Q_B = +C_B \times 0 - P(0)A = +C_B(3-V_f) - P(V_f)A \quad (1)$$

where A is the area of the ferroelectric capacitor, and $C_B$ is the parasitic capacitance of the bit line.

Equation (1) can be rewritten as:

$$P(V_f) = P(0) + C_B(3-V_f)/A \quad (2)$$

Based on equation (2), the voltage $V_f$ applied to the ferroelectric capacitor in during plate pulse sensing is given by the coordinate value on the abscissa at the intersection between the hysteresis characteristics $P=P(V_f)$ of the ferroelectric capacitor and $P=P(0)+C_B(3-V_f)/A$. Therefore, the voltage $V_f$ when polarization inversion occurs from polarization directed downward (high level), the voltage $V_f$ when polarization inversion does not occur from polarization directed upward (low level side), and the voltage $V_f$ by the dummy cell are obtained as shown in FIG. 4. Each bit line potential is also obtained on the basis of equation (3) as shown in FIG. 4.

$$V_B = 3 - V_f \quad (3)$$

According to the hysteresis characteristics of the cell, the gradient of $P(V_f)A$ with respect to the voltage $V_f$ is proportional to the electrostatic capacitance of the cell. Pieces of information stored in the bit lines BL and $\overline{BL}$ belonging to the selected column 302 are sent to the common read data lines DL and $\overline{DL}$ through the transistors 300 and 301 for selecting the column, respectively.

Generally, a sense amplifier is constituted by a flip-flop including p-channel MOS (PMOS) transistors 217 to 219 and n-channel MOS (NMOS) transistors 220 to 223, as shown in FIG. 5. The PMOS transistor 217 and NMOS transistor 223 serve as a power switch of the flip-flop. When a gate 206 of the Transistor 217 is at level "0", and a node 203 of the transistor 223 is at level "1", the flip-flop is activated to start the sense operation. Normally, to decrease the through current flowing from a power supply T to a ground point 2 through the PMOS and NMOS transistors in the flip-flop, the ON timings of the transistors 217 and 223 as a power supply switch are shifted. When common read data lines are to be precharged to the power supply voltage, the switching speed of the data line DL or $\overline{DL}$ is determined on the basis of the change speed from high level to low level. Therefore, the sense amplifier drives the bit line from the NMOS transistor side.

As is apparent from FIG. 4, the electrostatic capacitance of the dummy cell is about twice that of the cell capacitor in the cell on the low level side. For example, assume that before the start of the sense operation, the potential of the bit line BL on the low level side is 1.0V, and the potential of the bit line $\overline{BL}$ on the dummy cell side is 1.1V. Since the potential of the gate (bit line BL) of the NMOS transistor 221 for reducing the potential of the bit line $\overline{BL}$ in the sense amplifier is slightly lower than that of the gate (bit line $\overline{BL}$) of the NMOS transistor 220 for reducing the potential of the bit line BL, the current driving capability of the transistor 220 for reducing the potential is higher than that of the transistor 221. In addition, since the electrostatic capacitance of the bit line $\overline{BL}$ viewed from the sense amplifier is larger than that of the bit line BL because of the large electrostatic capacitance of the dummy capacitor of the bit line $\overline{BL}$, the potential of the bit line BL decreases at a higher speed than that for the bit line BL. That is, the potential difference between the bit line BL and $\overline{BL}$ increases. Immediately after this, the PMOS transistor 217 is turned on. Since the gate potential of the PMOS transistor 219 for increasing the potential of the bit line $\overline{BL}$ is lower than that of the PMOS transistor 218 for increasing the potential of the bit line BL, the current driving capability of the transistor 219 for increasing the potential is higher than that of the transistor 218. Dn the other hand, since the electrostatic capacitance of the bit line $\overline{BL}$ viewed from the sense amplifier is larger than that of the bit line BL, the potential of the bit line BL increases at a higher speed than that for the bit line $\overline{BL}$. When the current driving capability difference between the transistors 219 and 218 is smaller than the electrostatic capacitance difference between the bit lines $\overline{BL}$ and BL, the potential of the bit line BL may increase at a higher speed than that for the bit line $\overline{BL}$, resulting in an erroneous operation.

Since the cell capacitor of the cell on the high level side draws a locus continued from polarization, the difference from the electrostatic capacitance of the dummy capacitor cannot be uniquely defined. In FIG. 4, the electrostatic capacitance of the cell on the high level side is much larger than that of the dummy capacitor. However, the electrostatic capacitance of the cell largely changes depending on the characteristics of the cell or the magnitude of the parasitic capacitance of the bit line.

For example, assume that before the start of the sense operation, the potential of the bit line BL on the high level side is 1.2V, and the potential of the bit line $\overline{BL}$ on the dummy cell side is 1.1V. As shown in FIG. 4, when the electrostatic capacitance of the cell on the high level side is larger than that on the dummy cell side, and the sense amplifier is driven from the NMOS transistor side, the potential difference between the bit lines BL and $\overline{BL}$ increases, as described above. When the PMOS transistor is subsequently driven, a locus indicated by the broken line in FIG. 4 is obtained. Since the electrostatic capacitance of the bit line BL viewed from the sense amplifier is smaller than that of the bit line $\overline{BL}$, the potential of the bit line BL increases at a higher speed than that for the bit line $\overline{BL}$, so data can be properly read.

Conversely, when the electrostatic capacitance of the cell on the high level side is smaller than that on the dummy cell side, and the sense amplifier is driven from the NMOS transistor side, the potential difference between the bit lines BL and $\overline{BL}$ decreases, as described above, and the potential relationship may be reversed.

As described above, not only the potential difference between the bit lines BL and $\overline{BL}$ before sensing but also the unbalance in electrostatic capacitance influences on the sense sensitivity, so data cannot be properly read in some cases.

A scheme of temporarily increasing the potential of a selected plate line to 3 (V) and then reducing the plate potential and sensing the potential is disclosed in Jpn. Pat. Appln. KOKAI Publication No. 1-158691 or Integrated Ferroelectrics, Vol. 4, pp. 134–144. FIG. 6 is a timing chart of this scheme. In the polarization inversion operation, it is actually supposed that a phenomenon in which the direction of polarization in the domain is actually reversed and a non-polarization inversion phenomenon (this can be regarded as relatively linear polarization due to electronic or ionic polarization) overlap each other. In this scheme, even when non-polarization inversion varies, this can be canceled by returning the plate potential to 0 (V), so variations in bit line to be sensed can be decreased. Hence, even the non-polarization inversion region varies in the reliability test, the influence can be minimized. This sensing scheme will be referred to as "after plate pulse sensing" hereinafter.

After plate pulse sensing will be analyzed below. The bit line potential in after plate pulse sensing is obtained by a graphic solution. FIG. 7 shows a change in charges in the ferroelectric capacitor or bit line capacitance in this scheme. The change from state (a) to state (b) in FIG. 7 is the same as in during plate pulse sensing. In the change from state (b) to state (c) as well, the bit line is not charged/discharged at all. For this reason, the amount of charges in the bit line in states (a) and (c) is kept unchanged. Hence, equation (4) holds:

$$Q_B = +C_B \times 0 - P(0)A = -C_B V_f - P(V_f)A \tag{4}$$

Equation (4) can be rewritten as $$P(V_f) = P(0) - C_B V_f / A \tag{5}$$

Based on equation (5), the voltage $V_f$ applied to the ferroelectric capacitor in after plate pulse sensing is given by the coordinate value on the abscissa at the intersection between the hysteresis characteristics $P=P(V_f)$ of the ferroelectric capacitor and $P=P(0)+C_B V_f/A$. Therefore, the voltage $V_f$ when polarization inversion occurs from polarization directed downward (high level) and the voltage $V_f$ when polarization inversion does not occur from polarization directed upward (low level) in after plate pulse sensing are obtained as shown in FIG. 8. Each bit line potential is also obtained on the basis of the equation below as shown in FIG. 8.

As is apparent from FIG. 7, even in after plate pulse sensing, the electrostatic capacitance of the cell largely changes between high level and low level. The capacitances of the bit lines BL and $\overline{BL}$ do not balance in sensing independently of the electrostatic capacitance of the dummy cell. Especially, in after plate pulse sensing, the potentials of the bit lines BL and $\overline{BL}$ are lower than those in during plate pulse sensing. For this reason, even when the sense amplifier is driven from the NMOS transistor side, the NMOS transistor is not turned on immediately after the start of the sense amplifier operation. Hence, the potential difference between the bit lines BL and $\overline{BL}$ cannot be obtained unless the PMOS transistor is driven. For example, assume that the electrostatic capacitance of the dummy cell is at the intermediate level between the electrostatic capacitances of the bit lines BL and $\overline{BL}$. In this case, like during plate pulse sensing, the potential difference between the bit lines BL and $\overline{BL}$ becomes small independently of high or low level due to the unbalance in electrostatic capacitance between the bit lines BL and $\overline{BL}$, and finally, the potential relationship may be reversed.

BRIEF SUMMARY OF THE INVENTION

It is the first object of the present invention to provide a semiconductor memory device capable of avoiding any erroneous operation due to the unbalance in electrostatic capacitance of a bit line pair.

It is the second object of the present invention to provide a data reading method for a semiconductor memory device capable of avoiding any erroneous operation due to the unbalance in electrostatic capacitance of a bit line pair.

The above-described first object of the present invention is achieved by a semiconductor memory device comprising a memory cell having a capacitor for storing data and a transistor for selecting the capacitor, a word line for driving the transistor in the memory cell, a first bit line connected to the capacitor in the memory cell through the transistor, a second bit line differentially paired with the first bit line, and a sense amplifier for amplifying a potential difference between the first and second bit lines, wherein before operation of the sense amplifier, the data stored in the memory cell is read to the first bit line, and simultaneously, a comparison potential is supplied to the second bit line, and sensing is performed while parasitic capacitances of the first and second bit lines during operation of the sense amplifier are substantially equalized.

According to this arrangement, sensing is performed while the parasitic capacitances of the first and second bit lines during operation of the sense amplifier are substantially equalized. When a sufficiently large potential difference is generated between the first and second bit lines, the potentials of the bit line pair do not change in wrong directions during operation of the sense amplifier. Therefore, any erroneous operation due to unbalance in electrostatic capacitance between the bit line pair can be avoided.

The first object of the present invention is also achieved by a semiconductor memory device comprising, a memory cell having a capacitor for storing data and a transistor for selecting the capacitor, a word line for driving the transistor in the memory cell, a first bit line connected to the capacitor in the memory cell through the transistor, a second bit line differentially paired with the first bit line, and a sense amplifier for amplifying a potential difference between the first and second bit lines, wherein after the data stored in the memory cell is read to the first bit line, and simultaneously, a comparison potential is supplied to the second bit line, the selected word line is temporarily set in an unselected state before sensing by the sense amplifier, and then, the sense amplifier is caused to perform sensing.

According to this arrangement, before sensing is performed by the sense amplifier, the selected word line is temporarily set in the unselected state, and then, the sense amplifier is operated. The parasitic capacitances of the first and second bit lines substantially equal, and the electrostatic capacitances of the bit line pair do not influence on sensing.

The first object of the present invention is also achieved by a semiconductor memory device comprising, a memory cell having a capacitor for storing data and a first transistor for selecting the capacitor, a dummy cell having a dummy capacitor for generating a comparison potential and a second transistor for selecting the dummy capacitor, a word line for driving the first transistor in the memory cell, a dummy word line for driving the second transistor in the dummy cell, a first bit line connected to the capacitor in the memory cell through the first transistor, a second bit line differentially paired with the first bit line and connected to the dummy capacitor in the dummy cell through the second transistor, and a sense amplifier for amplifying a potential difference between the first and second bit lines, wherein before operation of the sense amplifier, the data stored in the memory cell is read to the first bit line, and simultaneously, the comparison potential generated by the dummy cell is output to the second bit line, and sensing is performed while parasitic capacitances of the first and second bit lines during operation of the sense amplifier are substantially equalized.

According to this arrangement, sensing is performed while the parasitic capacitances of the first and second bit lines during operation of the sense amplifier are substantially equalized. When a sufficiently large potential difference is generated between the first and second bit lines, the potentials of the bit line pair do not change in erroneous directions during operation of the sense amplifier. Therefore, any erroneous operation due to unbalance in electrostatic capacitance between the bit line pair can be avoided.

The first object of the present invention is also achieved by a semiconductor memory device comprising, a memory cell having a capacitor for storing data and a first transistor for selecting the capacitor, a dummy cell having a dummy capacitor for generating a comparison potential and a second transistor for selecting the dummy capacitor, a word line for driving the first transistor in the memory cell, a dummy word line for driving the second transistor in the dummy cell, a first bit line connected to the capacitor in the memory cell through the first transistor, a second bit line differentially paired with the first bit line and connected to the dummy capacitor in the dummy cell through the second transistor, and a sense amplifier for amplifying a potential difference between the first and second bit lines, wherein after the data stored in the memory cell is read to the first bit line, and simultaneously, a comparison potential generated by the dummy cell is output to the second bit line, the selected word line and the selected dummy word line are temporarily set in an unselected state before sensing by the sense amplifier, and then, the sense amplifier is caused to perform sensing.

According to this arrangement, before sensing is performed by the sense amplifier, the selected word line and selected dummy word line are temporarily set in the unselected state, and then, the sense amplifier is operated. The parasitic capacitances of the first and second bit lines substantially equal, and the electrostatic capacitances of the bit line pair do not influence on sensing.

The second object of the present invention is achieved by a data reading method for a semiconductor memory device comprising a memory cell having a capacitor for storing data and a transistor for selecting the capacitor, a word line for driving the transistor in the memory cell, a first bit line connected to the capacitor in the memory cell through the transistor, a second bit line differentially paired with the first bit line, and a sense amplifier for amplifying a potential difference between the first and second bit lines, comprising the first step of reading the data stored in the memory cell to the first bit line and supplying a comparison potential to the second bit line, the second step of substantially equalizing parasitic capacitances of the first and second bit lines after the first step, and the third step of operating the sense amplifier to amplify the potential difference between the first and second bit lines after the second step.

According to this data reading method, before sensing by the sense amplifier, the parasitic capacitances of the first and second bit lines are equalized. When a sufficiently large potential difference is generated between the bit line pair, the potentials of the bit line pair do not change in erroneous directions during sensing. Therefore, any erroneous operation due to unbalance in electrostatic capacitance between the bit line pair can be avoided.

The second object of the present invention is also achieved by a data reading method for a semiconductor memory device comprising a memory cell having a capacitor for storing data and a transistor for selecting the capacitor, a word line for driving the transistor in the memory cell, a first bit line connected to the capacitor in the memory cell through the transistor, a second bit line differentially paired with the first bit line, and a sense amplifier for amplifying a potential difference between the first and second bit lines, comprising the first step of selecting the word line to drive the transistor in the memory cell, thereby reading the data stored in the memory cell to the first bit line, and supplying a comparison potential to the second bit line, the second step of setting the selected word line in an unselected state to disconnect the first bit line from the memory cell after the first step, and the third step of operating the sense amplifier to amplify the potential difference between the first and second bit lines after the second step.

According to this data reading method, before sensing by the sense amplifier, the selected word line is temporarily set in the unselected state. The memory cell is disconnected from the first bit line, and the electrostatic capacitance does not influence on sensing. Hence, any erroneous operation due to unbalance in electrostatic capacitance between the bit line pair can be avoided.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

First Embodiment

Figure 9:
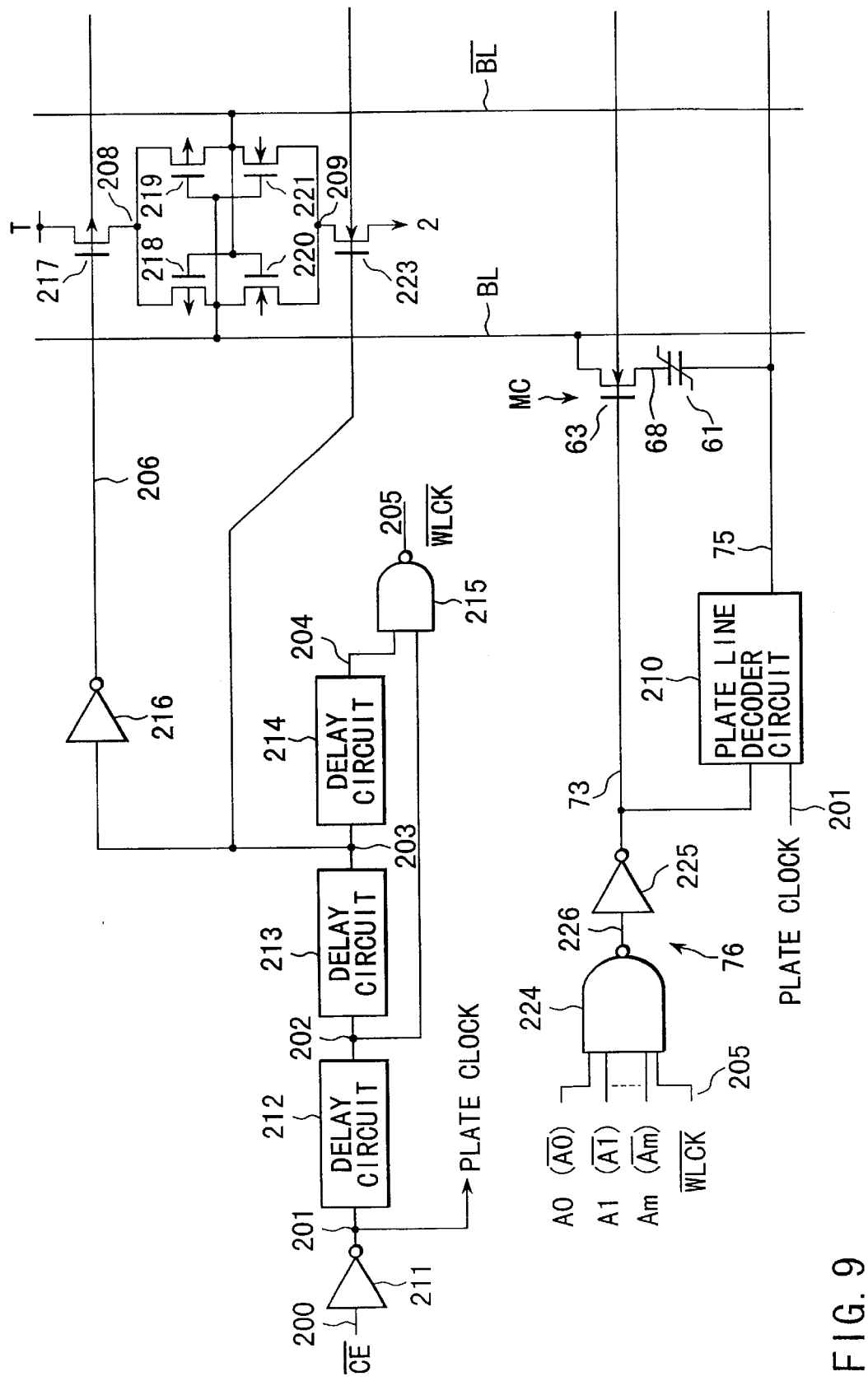
FIG. 9 is a circuit diagram showing a portion of a ferroelectric memory in during plate pulse sensing, which is associated with operation from chip selection to the end of sensing by a sense amplifier, so as to explain a semiconductor memory device according to the first embodiment of the present invention.

FIG. 9 shows a basic circuit in a ferroelectric memory in during plate pulse sensing of the present invention. In FIG. 9, a portion associated with operation from chip selection to the end of sensing by a sense amplifier is particularly shown.

A chip selection signal $\overline{CE}$ is input to the input terminal (node 200) of an inverter 211. The output terminal (node 201) of the inverter 211 is connected to the input terminal of a delay circuit 212 and the first input terminal of a plate line decoder circuit 210. The output terminal (node 202) of the delay circuit 212 is connected to the input terminal of a delay circuit 213 and one input terminal Cf a NAND gate 215. The output terminal (node 203) of the delay circuit 213 is connected to the input terminal of a delay circuit 214 and the input terminal of an inverter 216. The output terminal (node 204) of the delay circuit 214 is connected to the other input terminal of the NAND gate 215. The output terminal (node 205) of the NAND gate 215 is connected to one input terminal of a NAND gate 224. Address signals A0 ($\overline{A0}$) to Am ($\overline{Am}$) are input to the remaining input terminals of the NAND gate 224. The output terminal (node 226) of the NAND gate 224 is connected to the input terminal of an inverter 225. The output terminal of the inverter 225 is connected to a word line 73 and the second input terminal of the plate line decoder circuit 210. The output terminal of the plate line decoder circuit 210 is connected to a plate line 75. The NAND gate 224 and inverter 225 serve as a word line decoder circuit 76 for decoding the address signals A0 ($\overline{A0}$) to Am ($\overline{Am}$) and a signal $\overline{WLCK}$ to drive the word line 73.

PMOS transistors 217, 218, and 219 and NMOS transistors 220, 221, and 223 constitute a sense amplifier for sensing the potential difference between bit lines BL and $\overline{BL}$. In this sense amplifier, the PMOS transistors 218 and 219 and the NMOS transistors 220 and 221 constitute a flip-flop circuit. The operation of this flip-flop circuit is controlled by the PMOS transistor 217 having a gate connected to the output terminal (node 206) of the inverter 216 and the NMOS transistor 223 having a gate connected to the output terminal (node 203) of the delay circuit 213. When the node 206 is set at level "0" and the node 203 at level "1", the PMOS transistor 217 and NMOS transistor 223 are rendered conductive to activate the flip-flop circuit, so the potential difference between the bit lines BL and $\overline{BL}$ is amplified.

The drain of a memory cell selection transistor 63 is connected to the bit line BL, and the gate of the selection transistor 63 is connected to the word line 73. A ferroelectric capacitor 61 is connected between the source (node 68) of the selection transistor 63 and the plate line 75.

Figure 10:
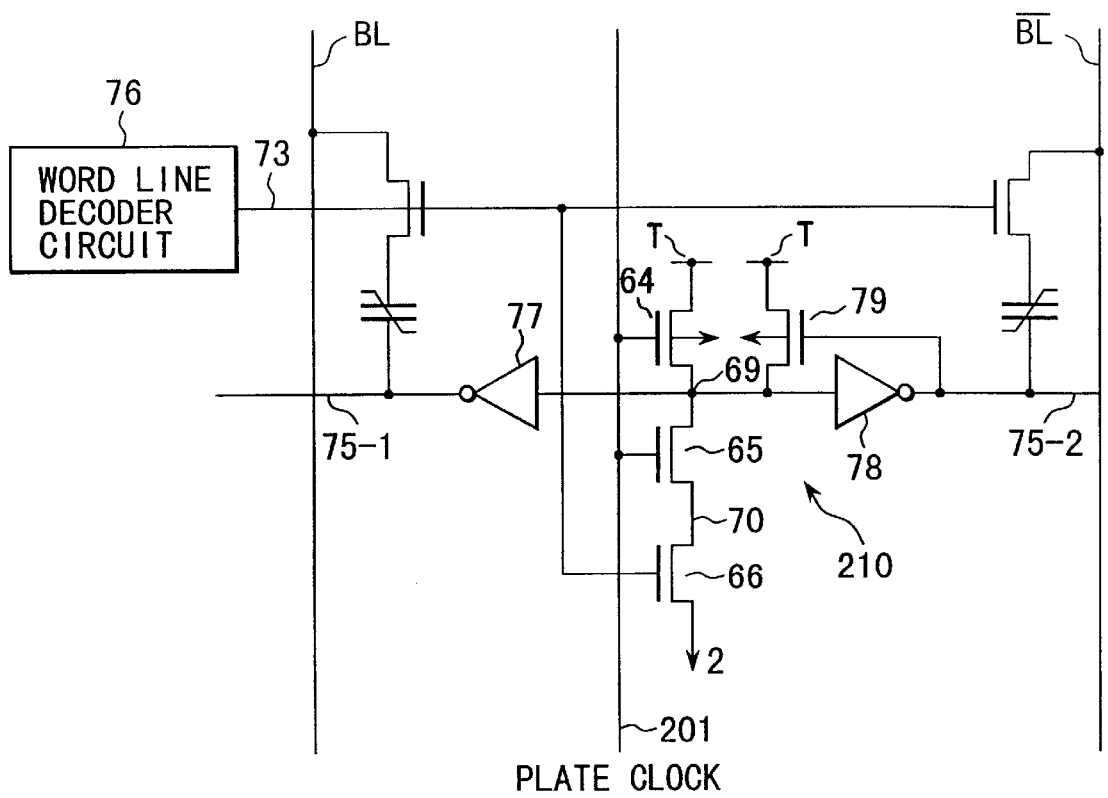
FIG. 10 is a circuit diagram showing the arrangement of a plate line decoder circuit in the circuit shown in FIG. 9.

FIG. 10 shows the arrangement of the plate line decoder circuit 210 in the circuit shown in FIG. 9. This decoder circuit 210 aims to reduce the pattern occupation area of the word line decoder circuit 76, i.e., the NAND gate 224 and inverter 225 in the circuit shown in FIG. 9. As shown in FIG. 10, the plate line decoder circuit 210 includes PMOS transistors 64 and 79, NMOS transistors 65 and 66, and inverters 77 and 78 and is controlled by the output signal from the word line decoder circuit 76 (potential of the word line 73) and the plate clock. The source of the PMOS transistor 64 is connected to a power supply T. A plate clock is supplied to the gate of the PMOS transistor 64. The drain of the NMOS transistor 65 is connected to the drain (node 69) of the PMOS transistor. The plate clock is supplied to the gate of the NMOS transistor 65. The drain of the NMOS transistor 66 is connected to the source (node 70) of the NMOS transistor 65, the gate is connected to the word line 73, and the source is connected to a ground point 2. The source of the PMOS transistor 79 is connected to the power supply T, the drain is connected to the node 69, and the gate is connected to the output terminal of the inverter 78. The input terminal of the inverter 77 is connected to the node 69, and the output terminal is connected to a plate line 75-1 of a memory cell connected to the bit line BL. The input terminal of the inverter 78 is connected to the node 69, and the output terminal is connected to a plate line 75-2 of a cell connected to the bit line $\overline{BL}$.

Only when both the output signal from the word line decoder circuit 76 (potential of the word line 73) and the plate clock are at level "1", the node 69 is set at level "0", and the plate lines 75-1 and 75-2 are selected by the inverters 77 and 78, so the plate line decoder circuit 210 is driven. Even when the output from the word line decoder circuit 76 is temporarily set at level "0" while the plate clock is kept at level "1", the node 69 is kept at level "0", so the plate lines 75-1 and 75-2 maintain level "1". In the plate line decoder circuit 210 in the unselected state, the node 69 is precharged to level "1" when the plate clock is at level "0". After this, since the word line 73 is kept at level "0", the node 69 at level "1" is not discharged, and this state is maintained. However, if this state continues for a long time, the potential of the node 69 may be lower due to, e.g., a leakage current from the junction. To prevent this, a latch circuit is constituted by the transistor 79 and inverter 78 to keep the node 69 at level "1", thereby preventing the potential from decreasing.

Figure 11:
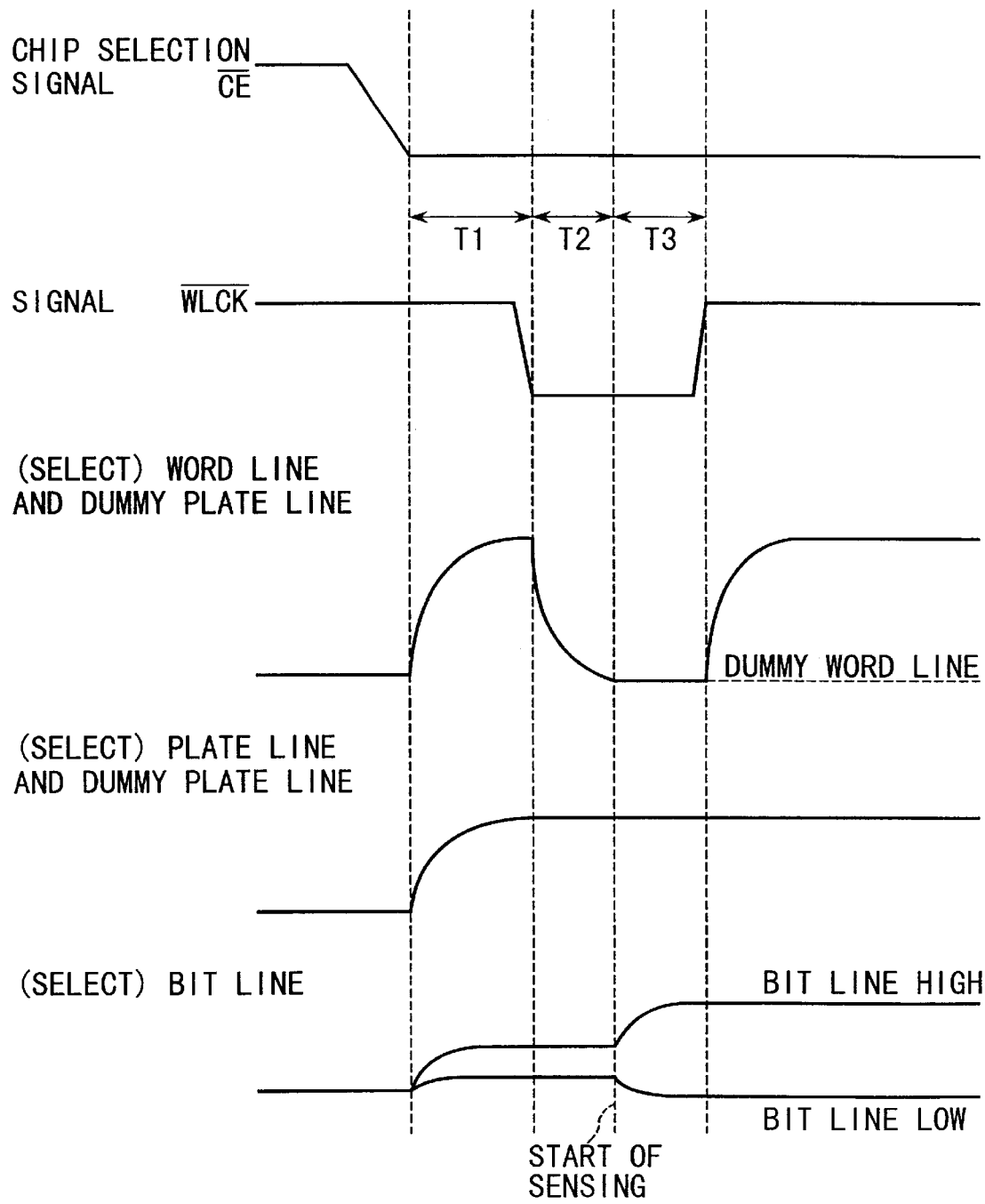
FIG. 11 is a timing chart showing during plate pulse sensing so as to explain the operation of the circuit shown in FIG. 9.

The operation of the above arrangement will be described next with reference to the timing chart of FIG. 11. When the chip selection signal $\overline{CE}$ is in the unselected state, i.e., at level "1", the nodes 201, 202, and 203 are at level "0" because of the output from the inverter 211. The delay circuit 214 outputs a delay signal obtained by inverting the input signal, so the node 204 is set at level "1". The signal $\overline{WLCK}$ output from the NAND gate 215 is at level "1", so the word line 73 and plate line 75 (75-1 and 75-2) are not driven. The output from the NAND gate 224 is determined by the address signals A0 ($\overline{A0}$) to Am ($\overline{Am}$). When the chip is unselected, all the address signals are at level "0", so the word line 73 is also at level "0". Since the potential of the node 201, i.e., the plate clock is at level "0", driving of the plate line 75 by the plate line decoder circuit 210 is not performed. Since the node 206 is at level "1", and the node 203 is at level "0", the sense amplifier is in the inactive state.

When the chip selection signal $\overline{CE}$ is set in the selected state, i.e., at level "0", the node 201 (plate clock) is set at level "1" because of the output from the inverter 211. Since the address signals A0 ($\overline{A0}$) to Am ($\overline{Am}$) are input, the selected word line 73 is almost simultaneously selected. Hence, the plate line 75 selected by the plate line decoder circuit 210 is also selected. The delay circuit 212 is a delay device having a delay time T1 corresponding to the RC delay of the plate line 75. For this reason, when a portion of the plate line 75 farthest from the plate line decoder circuit 210 is set at level "1", the node 202 is also set at level "1". Since the node 204 still maintains level "1" because of the delay time of the delay circuit 213 (delay time T2) and the delay circuit 214 (delay time T3), the node 205 (signal $\overline{WLCK}$) is inverted to level "0". With this operation, the output from the NAND gate 224 is set at level "1", and the selected word line 73 is set in the unselected state. The plate clock input to the plate line decoder circuit 210 at this time is at level "1" while the plate line 75 is still at level "1". The delay circuit 213 is a delay device having the delay time T2 corresponding to the delay in the word line when a portion of the word line 73 farthest from the word line decoder circuit 76 is set at level "0", the node 203 is set at level "1". With this operation, the sense amplifier is activated, and the potential difference between the bit lines BL and $\overline{BL}$ is amplified. The delay circuit 214 (delay time T3) is a delay device for ensuring a time necessary for the sense amplifier to perform the sense operation. When the sense operation is ended, the node 204 is set at level "0", and the node 215 (signal $\overline{WLCK}$) returns to level "1". Therefore, the unselected state of the word line 73 is canceled, and the word line 73 returns to level "1".

Figure 1:
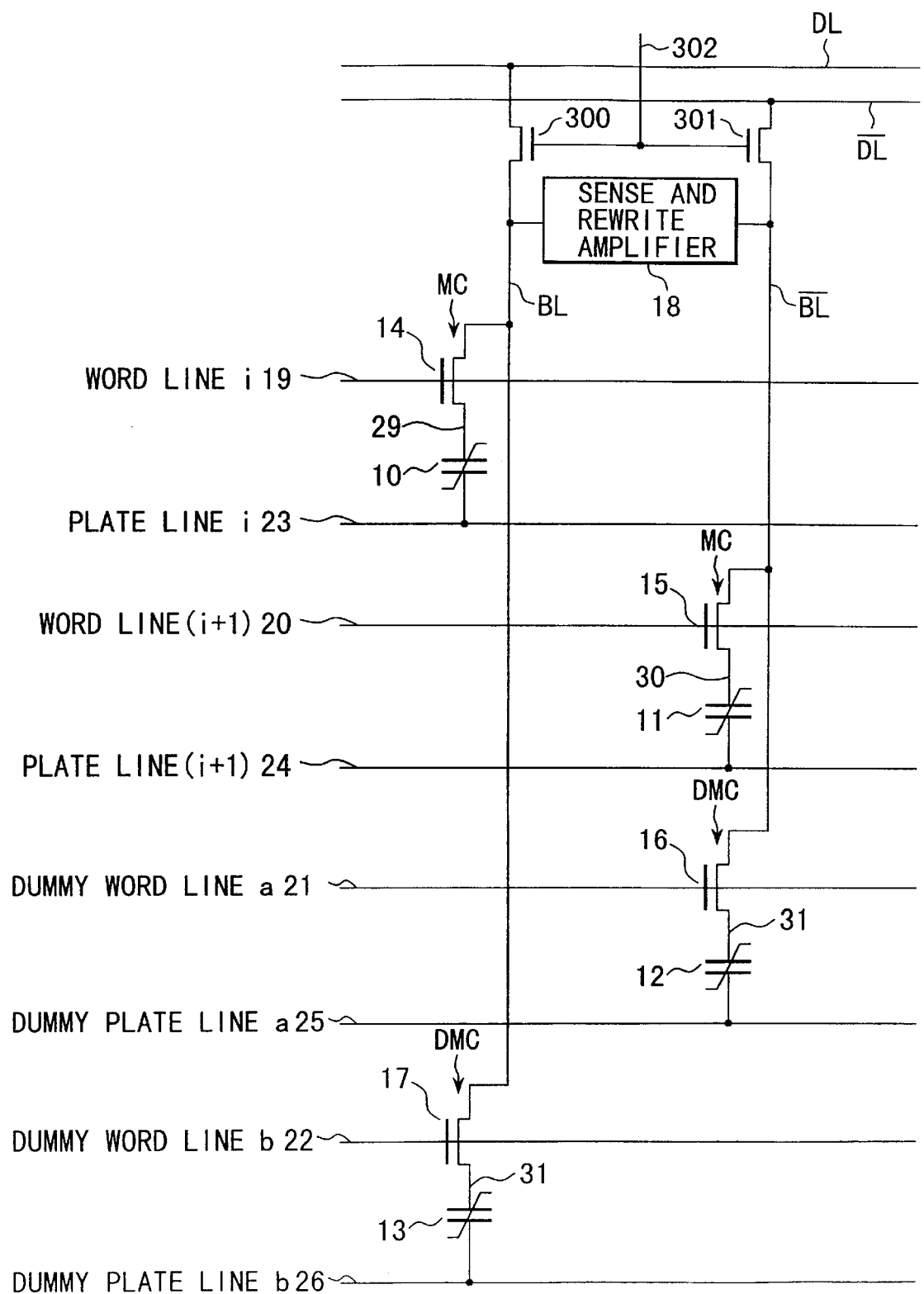
FIG. 1 is a circuit diagram showing a circuit arrangement as a basic ferroelectric memory so as to explain a conventional semiconductor memory device.
Figure 2:
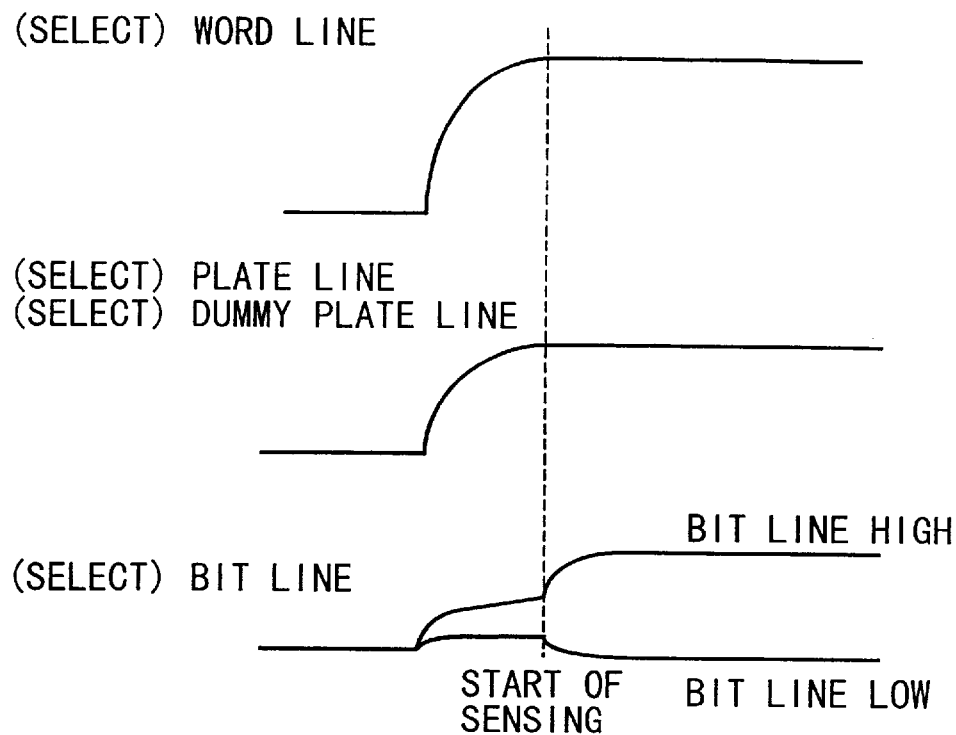
FIG. 2 is a timing chart showing during plate pulse sensing so as to explain the operation of the circuit shown in FIG. 1.
Figure 3:
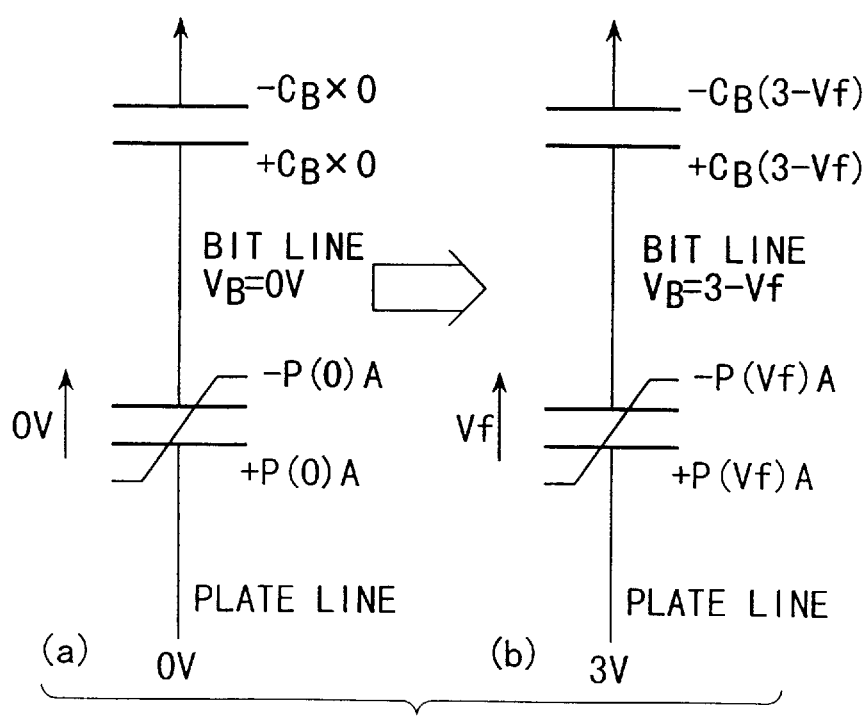
FIG. 3 is an equivalent circuit diagram for explaining the bit line potential, the stray capacitance of the bit line, and a change in charges in the ferroelectric capacitor in during plate pulse sensing.
Figure 4:
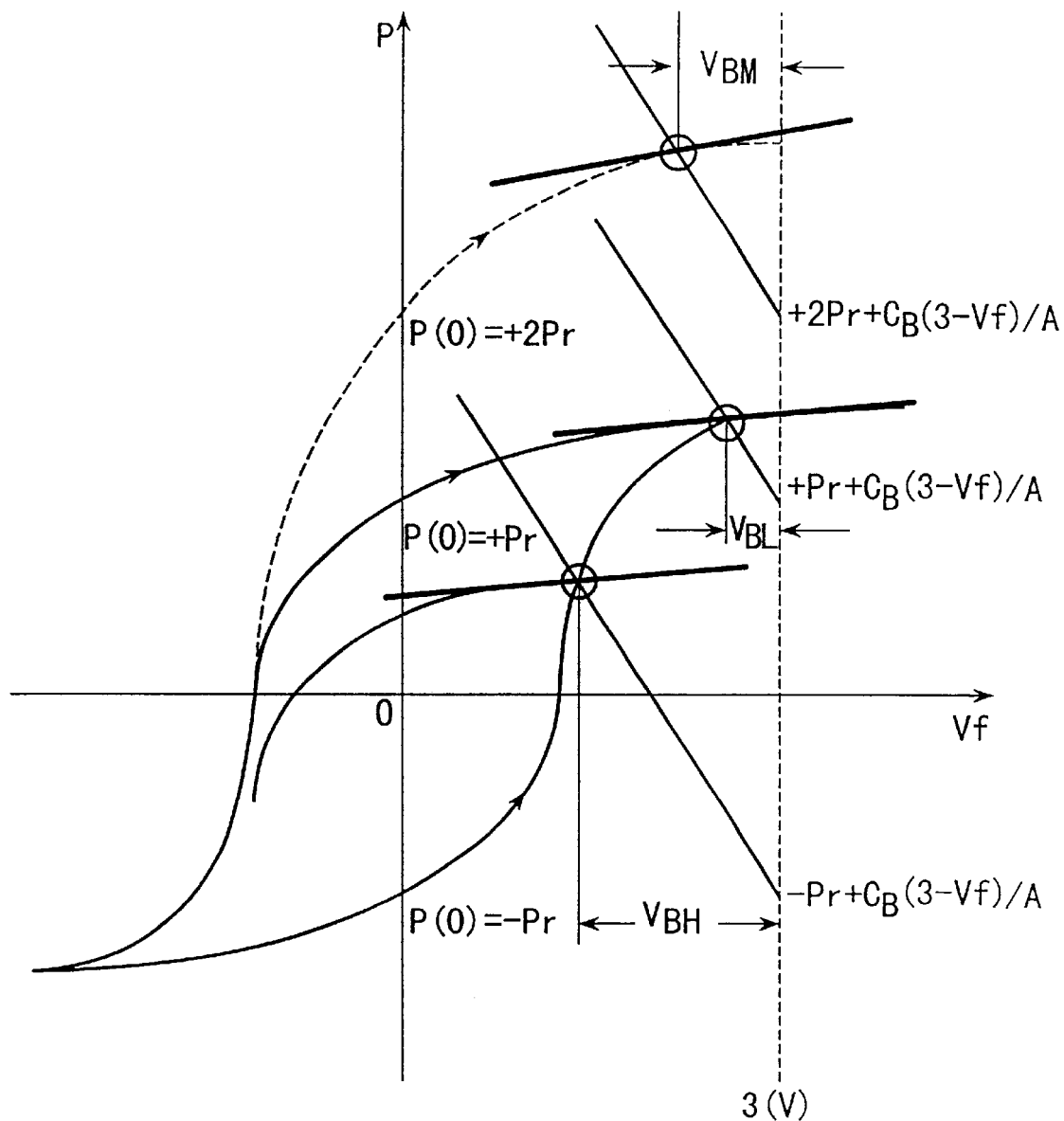
FIG. 4 is a graph for explaining solution of the bit line potential in during plate pulse sensing.
Figure 5:
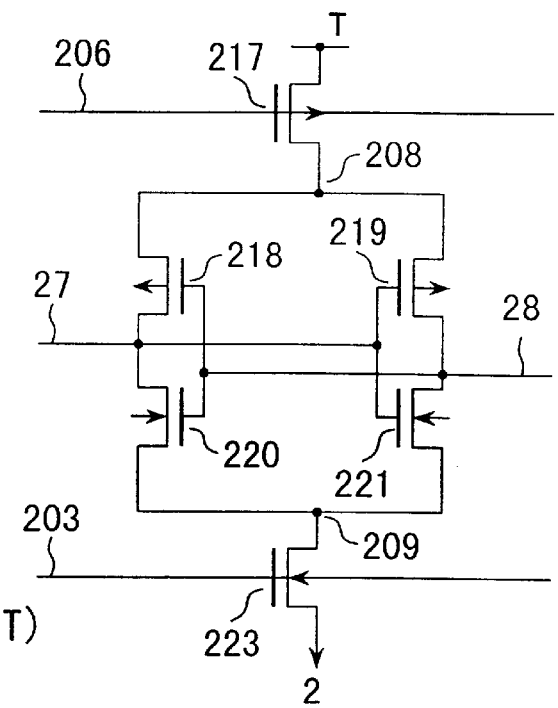
FIG. 5 is a circuit diagram showing a conventional sense amplifier.
Figure 6:
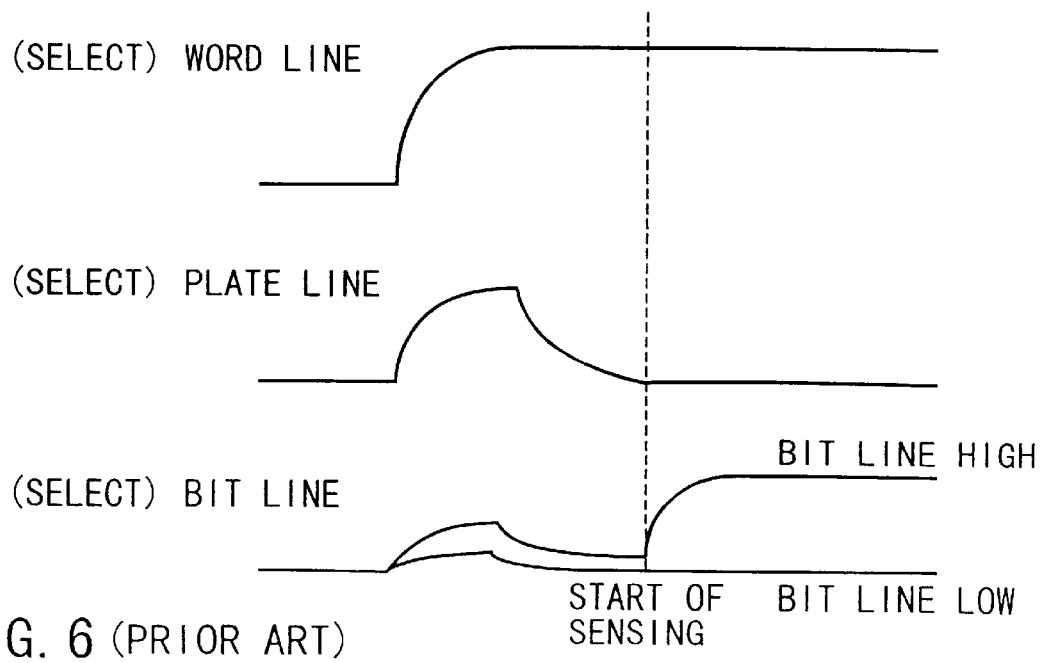
FIG. 6 is a timing chart of after plate pulse sensing.
Figure 7:
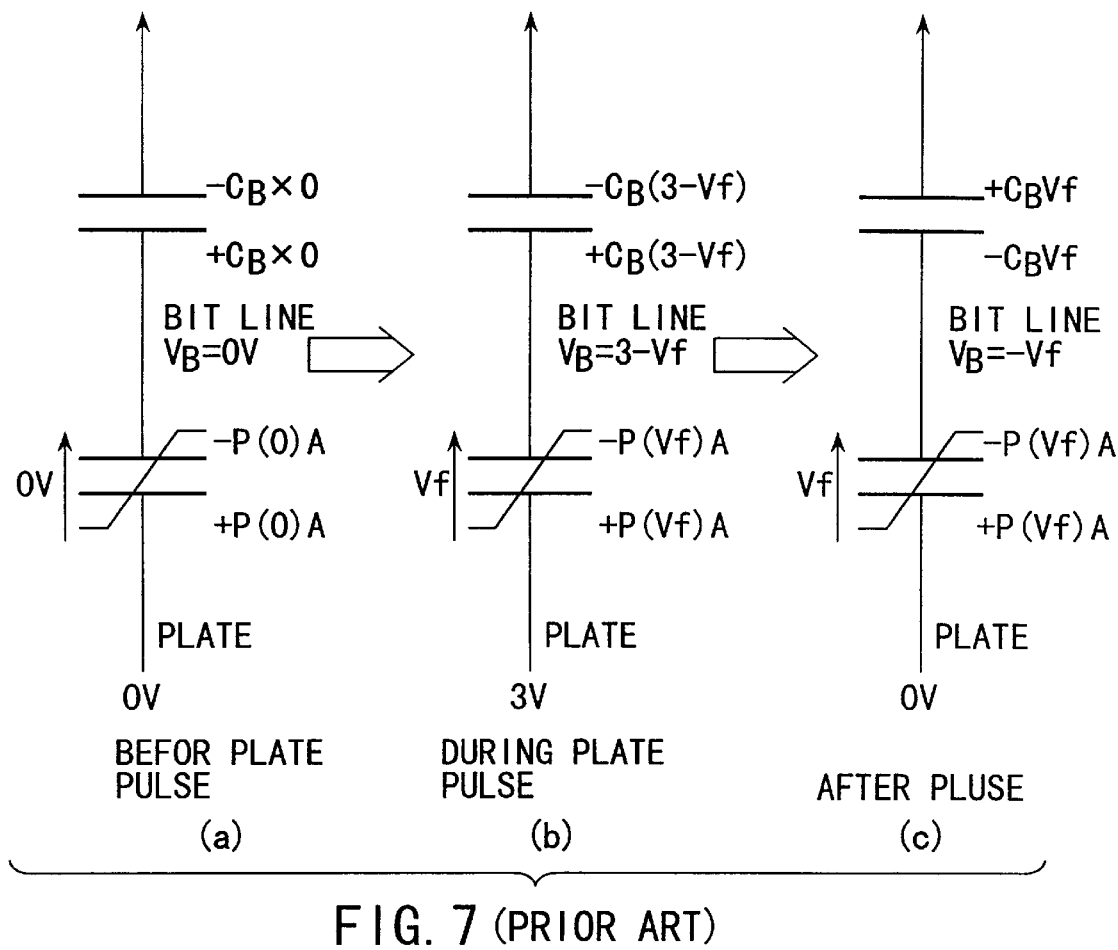
FIG. 7 is an equivalent circuit diagram for explaining the bit line potentials, the stray capacitances of the bit line, and a change in charges in the ferroelectric capacitor in during plate pulse sensing and after plate pulse sensing.

In FIG. 9, the dummy cell, dummy word line, and dummy plate line are not illustrated. Basically, these elements have the same arrangement as that of the conventional circuit shown in FIG. 1, and the dummy word line and dummy plate line are driven like the word and plate lines. In this manner, the operation shown in the timing chart of FIG. 11 is realized.

As described above, in the first embodiment of the present invention, after the word line (and dummy word line) and the plate line (and dummy plate line) are selected, the word line (dummy word line) is temporarily set in the unselected state to disconnect the bit ferroelectric capacitor from the bit line, and in this state, the sense amplifier is operated. At this time, since the electrostatic capacitance of the bit line is determined depending on the pattern arrangement of the cell, the symmetry of electrostatic capacitance can be easily improved. Hence, the bit line potential before the sense amplifier is operated can be accurately sensed by comparing the bit line potential with the intermediate level generated by the dummy cell. When a large potential difference is generated between the bit lines BL and $\overline{BL}$ by accurate sensing, the word line (dummy word line) is selected again, and the read contents are rewritten. However, as indicated by the broken line in FIG. 11, the dummy word line need not always be selected again.

According to the above arrangement and access method, even when the electrostatic capacitance of the memory cell and that of the dummy cell do not balance, the potentials of the bit lines BL and $\overline{BL}$ do not change in erroneous directions as far as a sufficiently large potential difference is generated between the bit lines BL and $\overline{BL}$. Therefore, any erroneous operation due to unbalance in electrostatic capacitance between the bit lines BL and $\overline{BL}$ can be avoided.

The cell capacitor in the dummy cell need not always be a ferroelectric capacitor and may be a capacitor using a normal dielectric such as $SiO_2$.

Second Embodiment

Figure 12:
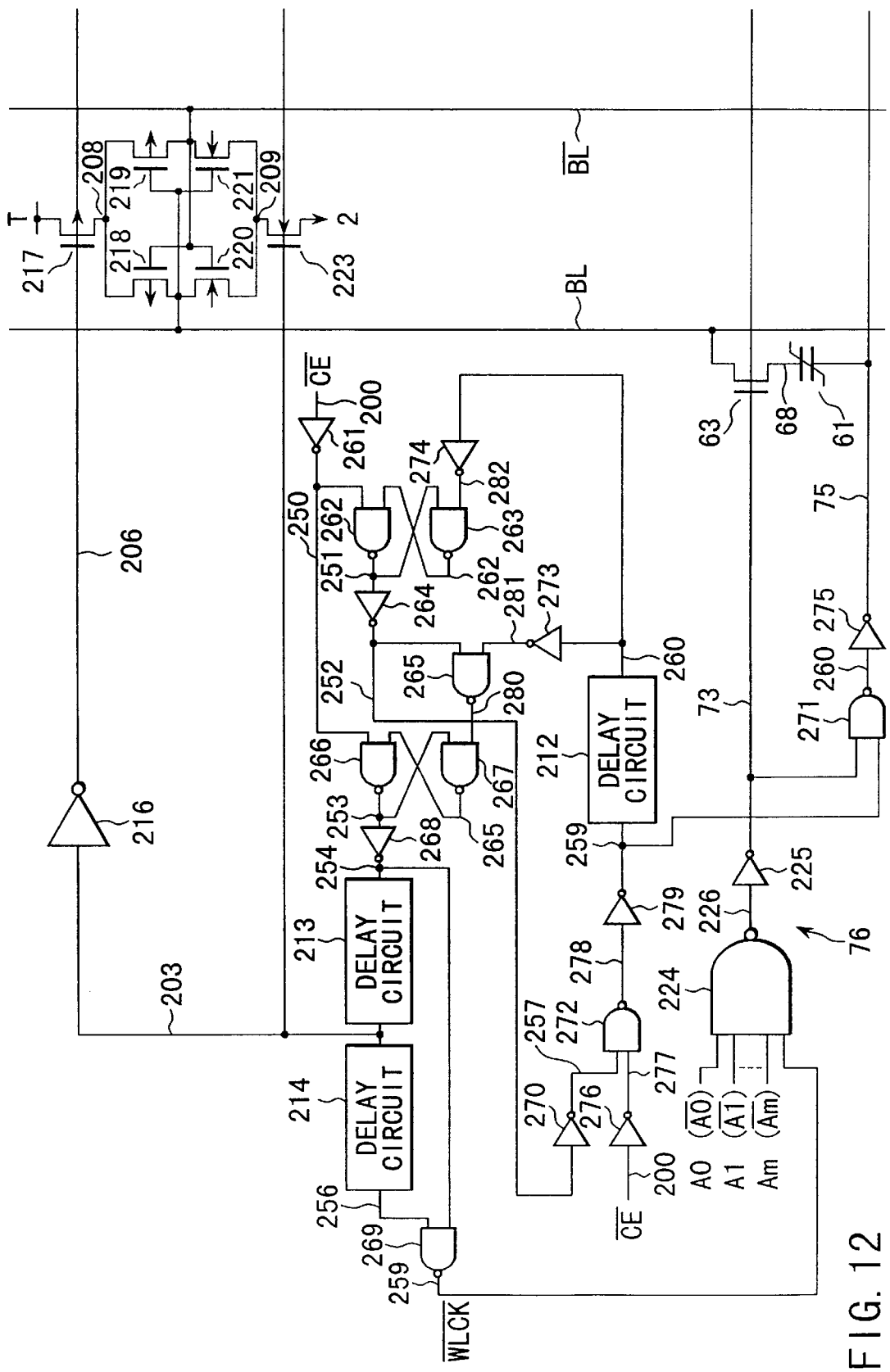
FIG. 12 is a circuit diagram showing a portion of a ferroelectric memory in after plate pulse sensing, which is associated with operation from chip selection to the end of sensing by a sense amplifier, so as to explain a semiconductor memory device according to the second embodiment of the present invention.

FIG. 12 shows a basic circuit in a ferroelectric memory in after plate pulse sensing of the present invention. In FIG. 12, a portion associated with operation from chip selection to the end of sensing by a sense amplifier is particularly shown.

A chip selection signal $\overline{CE}$ is input to the input terminal (node 200) of an inverter 261. The output terminal (node 250) of the inverter 261 is connected to one of the input terminals of each of NAND gates 262 and 266. The other input terminal of the NAND gate 262 is connected to the output terminal (node 262) of a NAND gate 263. The output terminal (node 251) of the NAND gate 262 is connected to one input terminal of the NAND gate 263 and the input terminal of an inverter 264. The output terminal (node 252) of the inverter 264 is connected to one input terminal of a NAND gate 265 and the input terminal of an inverter 273. The output terminal (node 280) of the NAND gate 265 is connected to one input terminal of a NAND gate 267. The output terminal (node 265) of the NAND gate 267 is connected to the other input terminal of the NAND gate 266. The output terminal (node 253) of the NAND gate 266 is connected to the other input terminal of the NAND gate 267 and the input terminal of an inverter 268. The output terminal of the inverter 268 is connected to the input terminal of a delay circuit 213 and one input terminal of a NAND) gate 269. The output terminal (node 203) of the delay circuit 213 is connected to the input terminal of a delay circuit 214 arid the input terminal of an inverter 216. The output terminal (node 256) of the delay circuit 214 is connected to the other input terminal of the NAND gate 269. The output terminal (node 259) of the NAND gate 269 is connected to one of the input terminals of a NAND gate 224. Address signals A0 ($\overline{A0}$) to Am ($\overline{Am}$) are input to the remaining input terminals of the NAND gate 224. The output terminal (node 226) of the NAND gate 224 is connected to the input terminal of an inverter 225. The output terminal of the inverter 225 is connected to a word line 73 and one input terminal of a NAND gate 271. The NAND gate 224 and inverter 225 serve as a word line decoder circuit 76 for decoding the address signals A0 ($\overline{A0}$) to Am ($\overline{Am}$) and signal $\overline{WLCK}$ to drive the word line 73.

The chip selection signal $\overline{CE}$ is supplied to the input terminal (node 200) of an inverter 276. The output terminal (node 257) of an inverter 270 and the output terminal (node 277) of the inverter 276 are connected to the input terminal of a NAND gate 272. The output terminal (node 278) of the NAND gate 272 is connected to the input terminal of an inverter 279. The output terminal (node 259) of the inverter 279 is connected to the input terminal of a delay circuit 212 and the other input terminal of the NAND gate 271. The output terminal (node 260) of the delay circuit 212 is connected to the input terminals of inverters 273 and 274. The output terminal of the inverter 273 is connected to the other input terminal of the NAND gate 265. The output terminal of the inverter 274 is connected to the other input terminal of the NAND gate 263.

PMOS transistors 217, 218, and 219 and NMOS transistors 220, 221, and 223 constitute a sense amplifier for sensing the potential difference between bit lines BL and $\overline{BL}$. The PMOS transistors 218 and 219 and the NMOS transistors 220 and 221 constitute a flip-flop circuit. The operation of th s flip-flop circuit is controlled by the PMOS transistor 217 having a gate connected to the output terminal (node 206) of the inverter 216 and the NMOS transistor 223 having a gate connected to the output terminal (node 203) of the delay circuit 213. When the node 206 is set at level "0" and the node 203 at level "1", the PMOS transistor 217 and NMOS transistor 223 are rendered conductive to activate the flip-flop circuit, so the potential difference between the bit lines BL and $\overline{BL}$ is amplified.

The output terminal (node 260) of the NAND gate 271 is connected to the input terminal of an inverter 275. The output terminal of the inverter 275 is connected to a plate line 75. The drain of a memory cell selection transistor 63 is connected to the bit line BL, and the gate of the selection transistor 63 is connected to the word line 73. A ferroelectric capacitor 61 is connected between the source (node 68) of the selection transistor 63 and the plate line 75.

Figure 13:
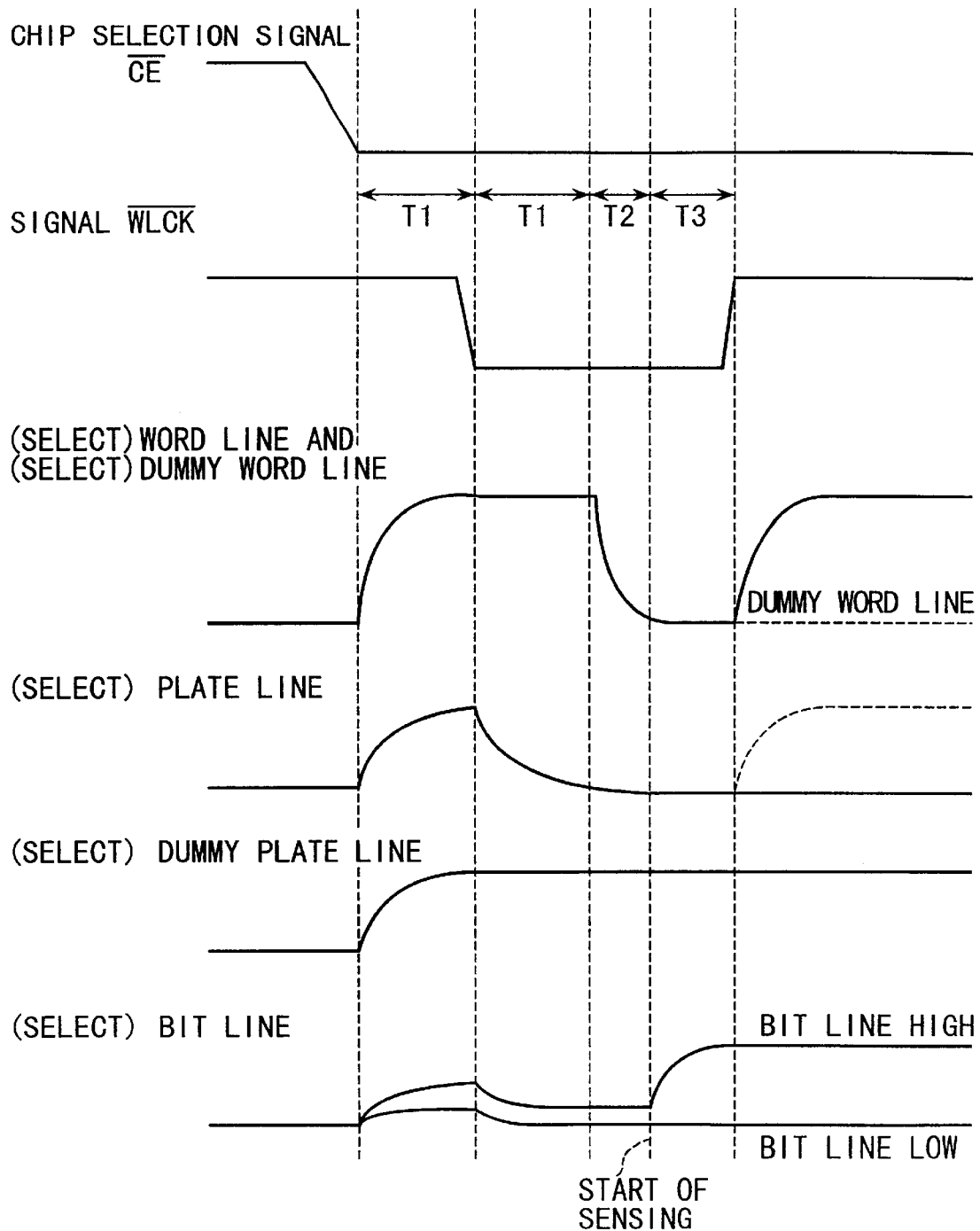
FIG. 13 is a timing chart showing after plate pulse sensing so as to explain the operation of the circuit shown in FIG. 12.

The operation of the above arrangement will be described next with reference to the timing chart of FIG. 13. When the chip selection signal $\overline{CE}$ is in the unselected state, i.e., at level "1", the node 250 is set at level "0" by the inverter 261, so the nodes 251 and 253 are set at level "1". In addition, the nodes 252 and 254 are set at level "0" by the inverters 264 and 268. At this time, the node 203 is also set at level "0". However, the node 256 is set at level "1"because the delay circuit 214 (delay time T3) outputs an inverted signal of the input signal. Since the node 206 is set at level "1" by the inverter 216, the PMOS transistor 217 and NMOS transistor 223 are not rendered conductive, and the sense amplifier is not activated. A signal of level "1" is output to the node 259 (signal $\overline{WLCK}$) by the NAND gate 269.

When the chip selection signal $\overline{CE}$ is at level "1", the node 277 is set at level "0" by the inverter 276. For this reason, the node 259 (plate clock) is set at level "0" by the NAND gate 272 and inverter 279. Since all the address signals A0 ($\overline{A0}$) to Am ($\overline{Am}$) are at level "0", all word lines 73 are also set at level "0", and all plate lines 75 are also set at level "0"by the NAND gate 271 and inverter 275. The node 260 is set at level "0" by the delay circuit 212 (delay time T1), and the outputs from the inverters 274 and 273 are set at level "1". Hence, the node 280 is set at level "1" by the NAND gate 265.

On the other hand, when the chip selection signal $\overline{CE}$ is selected and set at level "0", the node 250 is set at level "1". However, the node 251 still stores the state of level "1" due to the flip-flop circuit constituted by the NAND gates 262 and 263. Therefore, the node 257 also maintains level "1". Since the node 277 is inverted from level "0" to level "1" in accordance with the chip selection signal $\overline{CE}$ of level "0", the node 259 (plate clock) is set at level "1". Since the address signals A0 ($\overline{A0}$) to Am ($\overline{Am}$) are input to the NAND gate 224, the selected word line 73 is almost simultaneously set at level "1". The plate line 75 corresponding to the selected word line 73 is also selected by the NAND gate 271 and inverter 275. The delay circuit 212 (delay time T1) is a delay device corresponding to the RC delay of the plate line 75. When a portion of the plate line 75 farthest from the plate line decoder circuit (NAND gate 271 and inverter 275) is set at level "1", the node 260 is also set at level "1". With this operation, signals of level "0"are output from both the inverters 274 and 273. Since the node 250 is at level "1", the output from the NAND gate 263 changes to level "1" while the node 251 is set at level "0". Hence, the node 257 is set at level "1"by the inverters 264 and 270. Consequently, the node 259 (plate clock) is set at level "0" by the NAND gate 272 and inverter 279. In addition, the plate line is set at level "0" by the NAND gate 271 and inverter 275. The delay circuit 212 is a delay device having the delay time T1 corresponding to the RC delay of the plate line 75. When a portion of the plate line 75 farthest from the plate line decoder circuit is set at level "0", the node 260 is also set at level "0". Since the output from the inverter 273 changes to level "1", and the output from the inverter 274 is also at level "1", the node 280 is set at level "0" by the NAND gate 265. Since the node 250 is at level "1", and the node 280 is at level "0", the node 253 is set at level "0" by the NAND gate 266, and the node 254 is set at level "1" by the inverter 268. Since the node 256 still maintains level "1" through the delay circuits 213 (delay time T2) and 214 (delay time T3), the node 259 (signal $\overline{WLCK}$) changes to level "0". With this operation, the selected word line 73 is set in the unselected state. At this time, the plate line 75 is kept set at level "0" by the NAND gate 271 and inverter 275. The delay circuit 213 is a delay device having the delay time T2 corresponding to the delay of the word line 73. When a portion of the word line 73 farthest from the word line decoder circuit is set at level "0", the node 203 is set at level "1". With this operation, the sense amplifier is activated to sense the potential difference between the bit lines BL and $\overline{BL}$. The delay circuit 214 (delay time T3) is a delay device for ensuring time necessary for the sense amplifier to perform the sense operation. When the sense operation is ended, the node 256 is set at level "0", and the node 259 (signal $\overline{WLCK}$) returns to level "1". Therefore, the unselected state of the word line 73 is canceled, and the word line 73 returns to level "1". At this time, the dummy word line need not always be selected again, as indicated by the broken line in FIG. 13. The plate line can be set either at level "0"as indicated by the solid line or at level "1" as indicated by the broken line. In this manner, the operation as shown in the timing chart of FIG. 13 is realized.

In the second embodiment, both of the selected word line and selected dummy word line are temporarily set in the unselected state, and in this state, the sense amplifier is activated to sense the potential. With this arrangement, any erroneous operation due to unbalance in electrostatic capacitance of the bit line pair can be avoided, as in the first embodiment.

Third Embodiment

Figure 14:
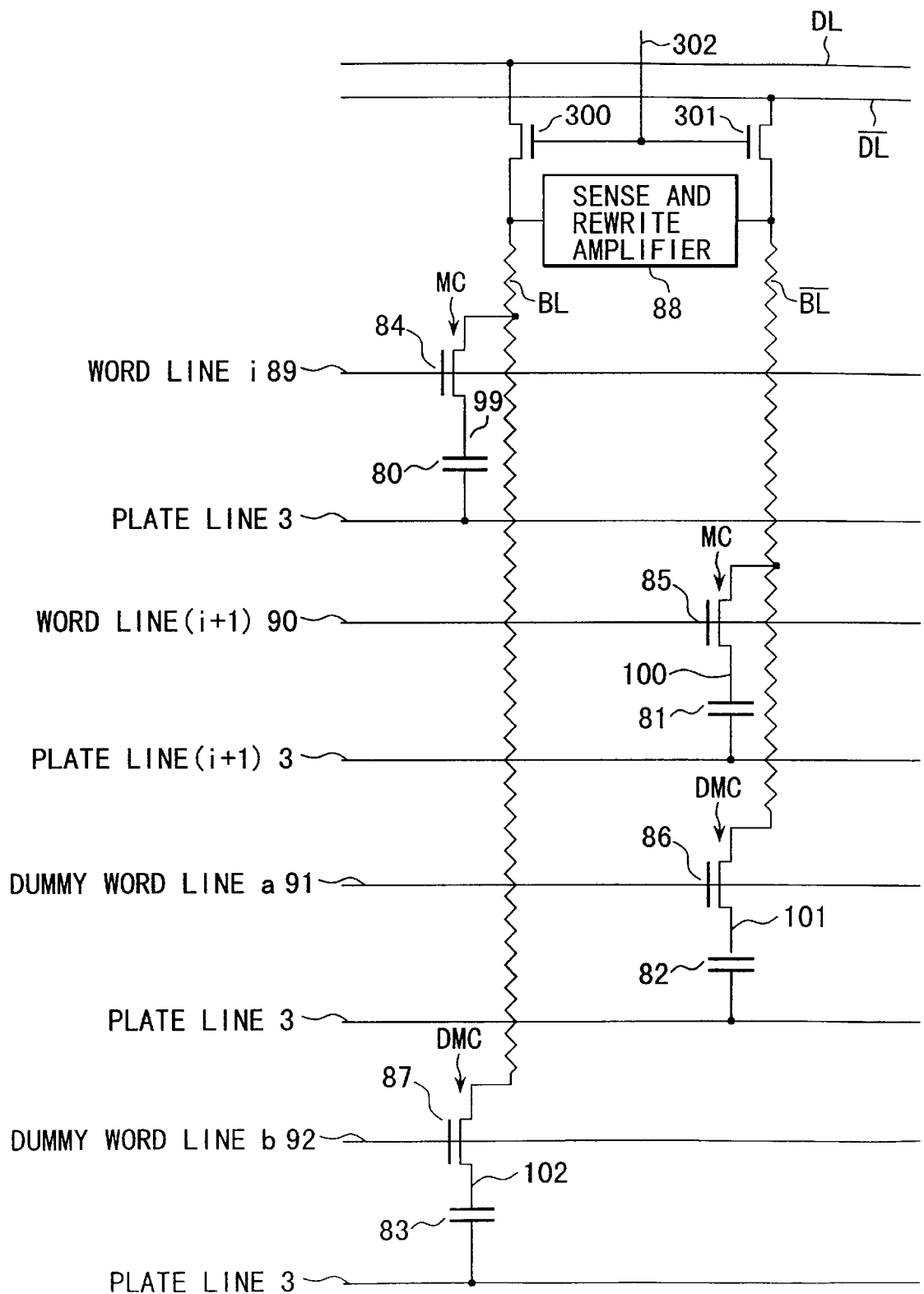
FIG. 14 is a circuit diagram showing a basic circuit arrangement of a DRAM so as to explain a semiconductor memory device according to the third embodiment of the present invention.

The above-described idea about the ferroelectric memory can also be easily applied to a DRAM. FIG. 14 shows the basic circuit arrangement of a DRAM. This circuit comprises memory cells MC, dummy cells DMC, a sense and rewrite amplifier (sense amplifier) 88, a word line i 89, a word line (i+1) 90, a dummy word line a 91, a dummy word line b 92, a plate line 3, a pair of bit lines BL and $\overline{BL}$ as a differential pair, transistors 300 and 301 for selecting a column, a column selection line 302, and pair of common read data lines DL and $\overline{DL}$. The memory cells MC have capacitors 80 and 81 and selection transistors 84 and 85, respectively. The dummy cells DMC have capacitors 82 and 83 and selection transistors 86 and 87, respectively. In the third embodiment, the resistance components of the bit lines BL and $\overline{BL}$ are put in question, so the bit lines BL and $\overline{BL}$ are indicated as resistances.

Unlike a ferroelectric memory, the plate line 3 is common to all memory cells and dummy cells and is set at a predetermined potential of 0.5 Vcc. Nodes 101 and 102 between the bit lines BL and $\overline{BL}$ and the dummy cells are also precharged to 0.5 Vcc. An example in which the word line 89 and dummy word line 91 are selected will be described.

In a DRAM, bit lines are often made of a material having a higher resistance (e.g., tungsten or polysilicon) than that of aluminum to minimize the cell area. Assume that the i=0th memory cell is formed near the sense amplifier 88 and away from the dummy cell. That is, the capacitor 80 is arranged near the sense amplifier 88 and the dummy capacitor 82 is arranged away from the sense amplifier 88. The capacitor 80 is easily driven as compared to the capacitor 82 because of the interconnection resistance between the sense amplifier 88 and each capacitor. Assume that data of high level is stored at a node 99. When the word line 89 rises, the potential of the bit line BL becomes higher than that on the bit line $\overline{BL}$ side. Normally, the sense amplifier 88 of the DRAM is constituted by a flip-flop circuit and driven from the NMOS transistor side. For this reason, the capacitor 80 which can be easily driven may change to low level earlier than the capacitor 82 and erroneously operate.

To prevent this, the RC delay of the bit line BL and that of the bit line $\overline{BL}$ in the DRAM are equalized, as in the ferroelectric memory. In other words, the parasitic capacitances of the bit lines are equalized. More specifically, before the sense operation is started, the word line 89 and dummy word line 91 are temporarily set in the unselected state, the potential difference is sensed, and then, the word line 89 is selected again. By temporarily setting the word line 89 and dummy word line 91 in the unselected state, charges read from the memory cell and dummy cell can be confined in the bit lines BL and $\overline{BL}$. Therefore, the influence of unbalance in electrostatic capacitance on the sense operation can be prevented. With this arrangement, any erroneous operation due to unbalance in electrostatic capacitance of the bit line pair can be avoided.

Fourth Embodiment

In a ferroelectric memory as well, the write and read can be performed while fixing the plate potential at 0.5 Vcc, as in the DRAM. In this case as well, the device may erroneously operate if the electrostatic capacitances of bit lines BL and $\overline{BL}$ do not balance during the operation of a sense amplifier. Even when the plate potential is fixed, the above-described measure is effective.

The effect of the present invention will be described in detail using actually measured values for a ferroelectric memory. Assume that the power supply voltage is set not at 3 (V) but at 5 (V).

Figure 8:
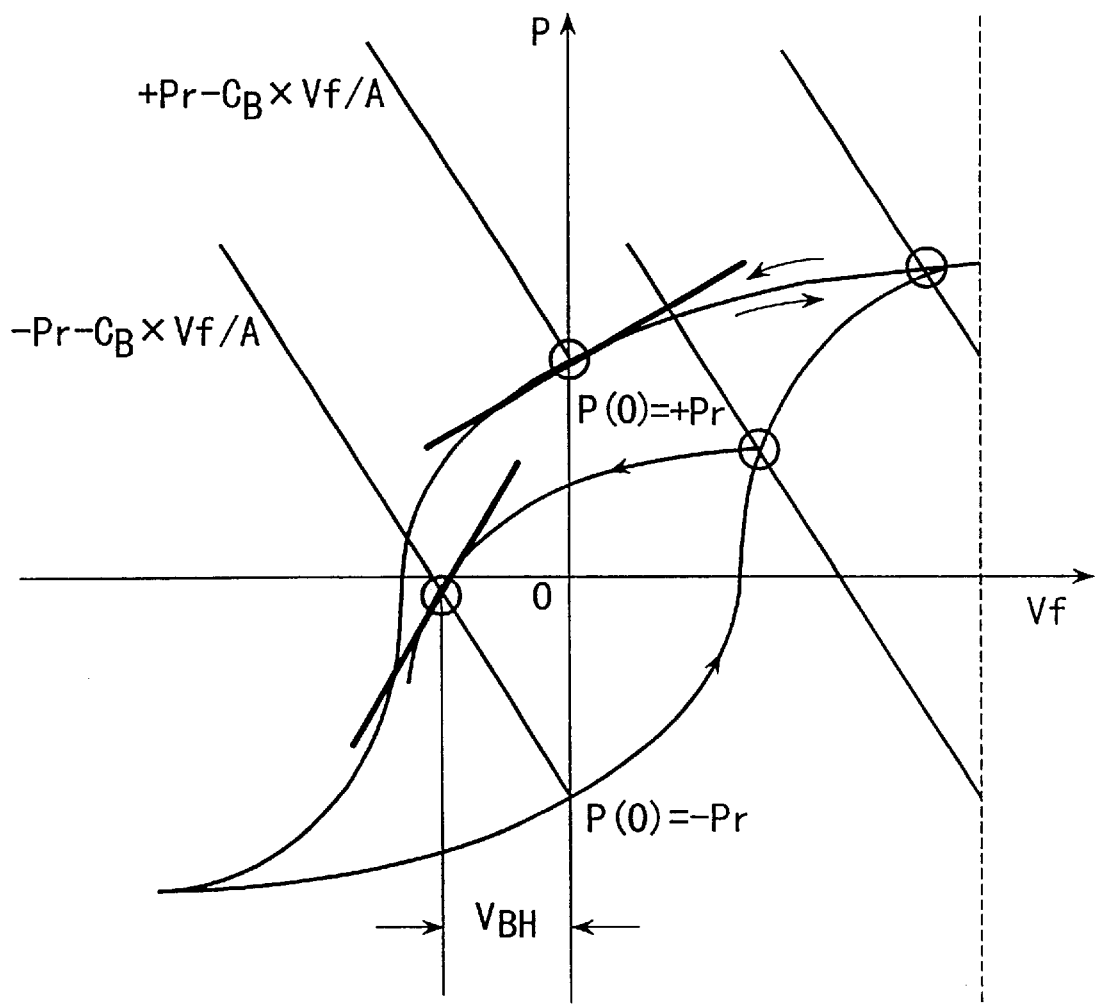
FIG. 8 is a graph for explaining a solution of the bit line potential in after plate pulse sensing.
Figure 15A:
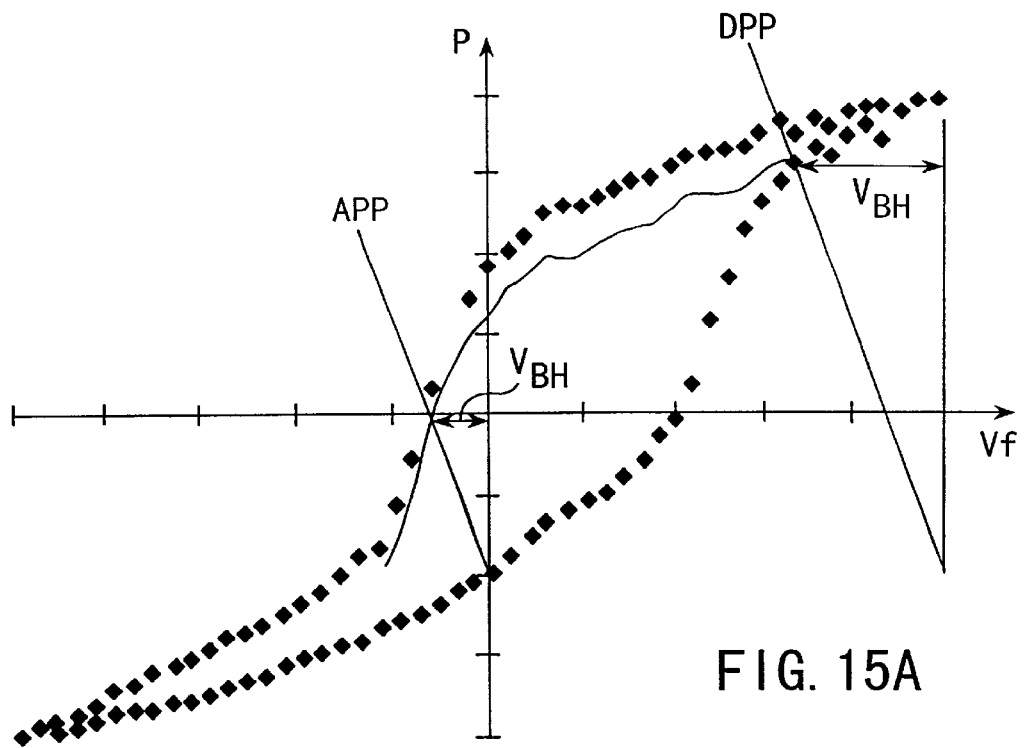
FIG. 15A is a graph showing the hysteresis characteristics obtained when a capacitor polarized downward is baked at a high temperature of 150° C. for 1,000 hrs.

As is well known, when a ferroelectric thin film in a polarized state is baked at a high temperature, the hysteresis characteristics are distorted to degrade the ferroelectric memory. FIG. 15A shows the hysteresis characteristics obtained when a capacitor polarized downward is baked at a high temperature of 150° C. for 1,000 hrs. For the illustrative convenience, the units are omitted. The abscissa represents the voltage, and one scale division corresponds to 1 (V). The ordinate represents polarization, and one scale division corresponds to 10 ($\mu$C/cm$^2$). Normally, when a capacitor polarized downward is baked for a long time, the hysteresis characteristics wholly shift to the right, as shown in FIG. 15A. According to FIG. 8, the high levels of the bit lines in during plate pulse sensing and after plate pulse sensing started from the same downward polarized state as in a case wherein the capacitor is baked can be graphically obtained. Assume that the bit line has an area A=5.26 ($\mu$m$^2$), and the bit line has a parasitic capacitance $C_B$=1.5 (pF). DDP represents (luring plate pulse sensing, and APP represents after plate pulse sensing hereinafter.

Figure 15B:
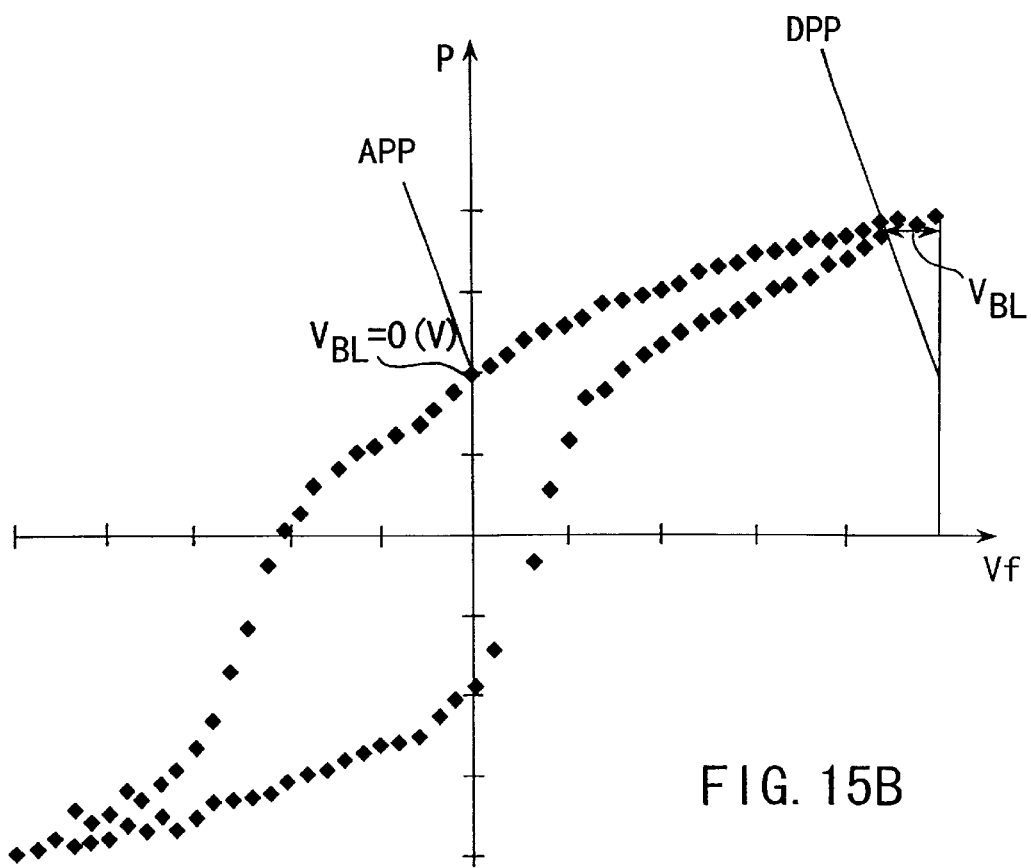
FIG. 15B is a graph showing the hysteresis characteristics obtained when a capacitor polarized upward is baked at a high temperature of 150° C. for 1,000 hrs.

FIG. 15B shows the hysteresis characteristics obtained when a capacitor polarized upward is baked at a high temperature of 150 ° C. for 1,000 hrs. Normally, when a capacitor polarized downward is baked for a long time, the hysteresis characteristics wholly shift to the left, as shown in FIG. 15B. According to FIG. 8, the low levels of the bit lines in during plate pulse sensing (DPP) and after plate pulse sensing (APP) started from the same upward polarized state as in a case wherein the capacitor is baked can be graphically obtained, as shown in FIG. 15B.

Figure 16A:
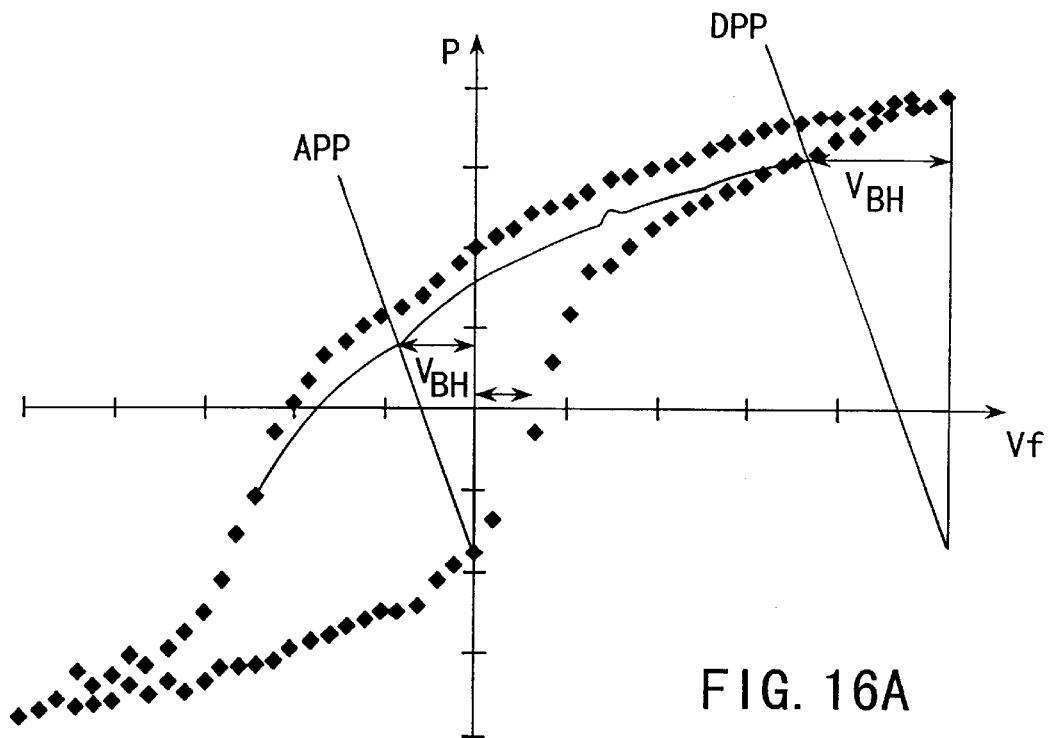
FIG. 16A is a graph showing the hysteresis characteristics obtained when a capacitor polarized upward is baked at a high temperature of 150° C. for 1,000 hrs.

FIG. 16A shows the hysteresis characteristics obtained when a capacitor polarized upward is baked at a high temperature of 150° C. for 1,000 hrs. Normally, when a capacitor polarized upward is baked for a long time, the hysteresis characteristics wholly shift to the left, as shown in FIG. 16A. According to FIG. 8, the high levels of the bit lines in during plate pulse sensing (DPP) and after plate pulse sensing (APP) started from the downward polarized state opposite to that in a case wherein the capacitor is baked can be graphically obtained.

Figure 16B:
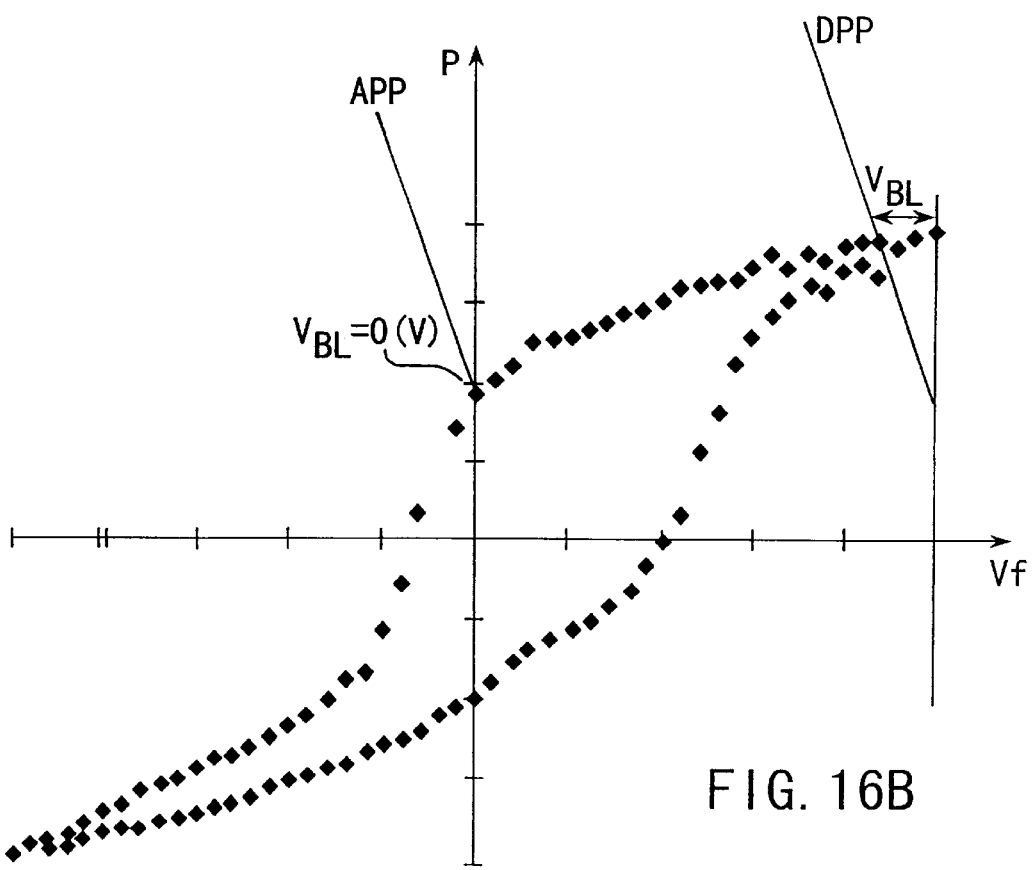
FIG. 16B is a graph showing the hysteresis characteristics obtained when a capacitor polarized downward is baked at a high temperature of 150° C. for 1,000 hrs.

FIG. 16B shows the hysteresis characteristics obtained when a capacitor polarized downward is baked at a high temperature of 150° C. for 1,000 hrs. Normally, when a capacitor polarized downward is baked for a long time, the hysteresis characteristics wholly shift to the right, as shown in FIG. 16B. According to FIG. 8, the high levels of the bit lines in during plate pulse sensing (DPP) and after plate pulse sensing (APP) started from the upward polarized state opposite to that in a case wherein the capacitor is baked can be graphically obtained.

Since the operating points are obtained, unbalance in electrostatic capacitance between cells will be considered. The unbalance in electrostatic capacitance is more conspicuous in after plate pulse sensing than in during plate pulse sensing, so an examination will be made for only this scheme. Assume that the electrostatic capacitance of the dummy cell is set at an intermediate point between bit line potentials. in after plate pulse sensing, the bit line potential is low and normally lower than the threshold voltage of the NMOS transistor, as can be seen in the graphs. For this reason, the bit line potential is sensed when the PMOS transistor is turned on, and the potentials of both the bit lines BL and $\overline{BL}$ increase. Referring to FIGS. 15A and 15B, when the same polarization as in baking is to be read, the electrostatic capacitance of the cell is obviously larger on the high level side ($V_{BH}$) than on the low level side ($V_{BL}$). This may increase the bit line potential on the dummy cell side with a smaller electrostatic capacitance, resulting in an erroneous operation. Conversely, referring to FIGS. 16A and 16B, when polarization opposite to that in baking is to be read, the electrostatic capacitance of the cell is obviously smaller on the high level side ($V_{BH}$) than on the low level side ($V_{BL}$). At this time, charges can be advantageously read on both the high and low level sides. In extreme case, even when the high and low level sides are inverted, charges may be read.

As described above, the prior art is very disadvantageous in reading the same polarization as in baking, and the reliability is very low. However, according to the present invention, the above-described problem is solved, and a highly reliable ferroelectric device can be realized.

As has been described above, according to the present invention, a semiconductor memory device capable of preventing any erroneous operation due to unbalance in electrostatic capacitance between bit lines and a data reading method therefor can be obtained.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   a word line;
   first and second bit lines;
   a plate line;
   a memory cell connected to the word line, the plate line and the first bit line, the memory cell having a transistor for transferring charges and a capacitor for storing the charges;
   a control circuit for generating second and third control signals in response to a first control signal;
   a decoder circuit connected to the word line, for selecting the word line in accordance with a plurality of address signals, the decoder circuit setting the selected word line in an unselected state in response to the second control signal;
   a sense amplifier connected to the first and second bit lines and activated in response to the third control signal; and
   a plate line decoder circuit for selecting the plate line based on the first control signal and the plate line control signal and setting the plate line in an unselected state before transition of the second control signal occurs.

2. The semiconductor device according to claim 1, further comprising a dummy cell having a ferroelectric capacitor and connected to the second bit line, the dummy cell setting the second bit line to a predetermined potential.

3. A semiconductor memory device comprising:
   a control circuit section for generating first to fourth control signals, transitions of the first to fourth signals sequentially taking place at first to fourth timings respectively;
   a decoder circuit section for setting a word line in a selected state in accordance with a plurality of address signals and outputting a plate line control signal, in response to a transition of the first control signal, setting the selected word line in an unselected state in response to a transition of the second control signal, and setting the word line in a selected state in response to a transition of the fourth control signal;

a plate line decoder circuit for, in response to a transition of the first control signal, selecting the plate line in accordance with the plate line control signal output from the decoder circuit section;

a first bit line which is set to a predetermined potential in response to a transition of the first control signal;

a second bit line which is set to a predetermined potential in response to a transition of the first control signal;

a transistor circuit section having a transistor and a ferroelectric capacitor, the transistor having a gate connected to the word line and a current path one end of which is connected to the first bit line, the ferroelectric capacitor having electrodes one of which is connected to the other end of the current path of the transistor and the other end of which is connected to the plate line, the first bit line and the ferroelectric capacitor being electrically separated when the word line is set in the unselected state in response to a transition of the second control signal, the first bit line and the ferroelectric capacitor being electrically connected when the word line is set in the selected state in response to a transition of the fourth control signal; and a sense amplifier section for amplifying a potential difference between the first bit line and the second bit line in response to a transition of the third control signal, wherein the plate line decoder circuit selects the plate line in accordance with the plate line control signal, in response to the transition of the first control signal, and sets the plate line in the unselected state in response to the transition of the second control signal.

4. A semiconductor memory device comprising:

a control circuit section for generating first to fourth control signals, transitions of the first to fourth sequentially taking place at first to fourth timings respectively;

a decoder circuit section for setting a word line in a selected state in accordance with a plurality of address signals and outputting a plate control signal, in response to a transition of the first control signal, setting the selected word line in an unselected state in response to a transition of the second control signal, and setting the word line in a selected state at the fourth timing in response to a transition of the fourth control signal;

a plate line decoder circuit for, in response to a transition of the first control signal, selecting the plate line in accordance with the plate line control signal output from the decoder circuit section;

a first bit line which is set to a predetermined potential at the first timing in response to a transition of the first control signal;

a second bit line which is set to a predetermined potential at the first timing in response to a transition of the first control signal;

a transistor circuit section having a transistor and a capacitor, the transistor having a gate connected to the word line and a current path one end of which is connected to the first bit line, the capacitor having electrodes one of which is connected to the other end of the current path of the transistor and the other of which is connected to the plate line, the first bit line and the capacitor being electrically separated when the word line is set in the unselected state in response to a transition of the second control signal, the first bit line and the capacitor being electrically connected when the word line is set in the selected state in response to a transition of the fourth control signal; and a sense amplifier section for amplifying a potential difference between the first bit line and the second bit line in response to a transition of the third control signal wherein the plate line decoder circuit selects the plate line in accordance with the plate line control signal, in response to the transition of the first control signal, and sets the plate line in the unselected state in response to the transition of the second control signal.

* * * * *